(12) United States Patent
May et al.

(10) Patent No.: US 7,672,403 B2
(45) Date of Patent: Mar. 2, 2010

(54) RADIO RECEIVER, SYSTEM ON A CHIP INTEGRATED CIRCUIT AND METHODS FOR USE THEREWITH

(75) Inventors: Michael R. May, Austin, TX (US); Erich Lowe, Austin, TX (US)

(73) Assignee: Sigmatel, Inc., Austin, TX (US)

(*) Notice: Subject to any disclaimer, the term of this patent is extended or adjusted under 35 U.S.C. 154(b) by 787 days.

(21) Appl. No.: 11/287,570

(22) Filed: Nov. 22, 2005

(65) Prior Publication Data

US 2007/0116150 A1    May 24, 2007

(51) Int. Cl.
*H03K 9/00* (2006.01)
*H04L 27/00* (2006.01)

(52) U.S. Cl. .................. 375/316; 375/147; 375/326; 375/354

(58) Field of Classification Search .......... 375/316, 375/136, 147, 326, 354
See application file for complete search history.

(56) References Cited

U.S. PATENT DOCUMENTS

| | | | |
|---|---|---|---|
| 5,448,245 A | 9/1995 | Takase | |
| 5,889,759 A | 3/1999 | McGibney | |
| 5,987,620 A | 11/1999 | Tran | |
| 6,021,110 A | 2/2000 | McGibney | |
| 6,633,187 B1 | 10/2003 | May et al. | |
| 6,728,325 B1* | 4/2004 | Hwang et al. | 375/355 |
| 2002/0064245 A1 | 5/2002 | McCorkle | |
| 2002/0111785 A1 | 8/2002 | Swoboda et al. | |
| 2005/0117071 A1* | 6/2005 | Johnson | 348/729 |

FOREIGN PATENT DOCUMENTS

WO    WO 2004/0039011    5/2004

OTHER PUBLICATIONS

International Search Report and Written Opinion, International Application No. PCT/US06/30209, Sep. 28, 2007.

* cited by examiner

*Primary Examiner*—Ted M Wang
(74) *Attorney, Agent, or Firm*—Toler Law Group

(57) ABSTRACT

A system on a chip integrated circuit includes a first in-phase digital submodule and a first quadrature phase digital submodule such that the first in-phase digital submodule and the first quadrature phase digital submodule are operable to produce at least one output signal based on at least one input signal. A digital clock generator generates a first in-phase digital clock signal having a plurality of first in-phase digital clock cycles over a predetermined period and a first quadrature phase digital clock signal having a plurality of first quadrature phase digital clock cycles over the predetermined period. The plurality of first in-phase digital clock cycles are substantially interleaved with the plurality of first quadrature phase digital clock cycles over the predetermined period.

12 Claims, 19 Drawing Sheets

RADIO RECEIVER, SYSTEM ON A CHIP INTEGRATED CIRCUIT AND METHODS FOR USE THEREWITH

CROSS REFERENCE TO RELATED PATENTS

The present application is related to the following U.S. patent applications that are commonly assigned:

Receiver and methods for use therewith, having Ser. No. 11/237,339, filed on Sep. 28, 2005;

Mixing module and methods for use therewith, having Ser. No. 11/237,344, filed on Sep. 28, 2005;

Controllable phase locked loop and method for producing an output oscillation for use therewith, having Ser. No. 11/126,553, filed on May 11, 2005;

Controllable phase locked loop via adjustable delay and method for producing an output oscillation for use therewith, having Ser. No. 11/153,144, filed on Jun. 15, 2005;

Programmable sample rate analog to digital converter and method for use therewith, having Ser. No. 11/152,910, filed on Jun. 15, 2005, now U.S. Pat. No. 7,199,739;

Clock generator, system on a chip integrated circuit and methods for use therewith, having Ser. No. 11/287,550, filed on Nov. 22, 2005, now U.S. Pat. No. 7,323,921;

Radio receiver, system on a chip integrated circuit and methods for use therewith, having Ser. No. 11/287,571, filed on Nov. 22, 2005;

Digital clock controller, radio receiver, and methods for use therewith, having Ser. No. 11/287,549, filed on Nov. 22, 2005;

Radio receiver, system on a chip integrated circuit and methods for use therewith, having Ser. No. 11/287,572, filed on Nov. 22, 2005, now U.S. Pat. No. 7,391,347;

Radio receiver, system on a chip integrated circuit and methods for use therewith, having Ser. No. 11/287,551, filed on Nov. 22, 2005; the contents of which are expressly incorporated herein in their entirety by reference thereto.

TECHNICAL FIELD OF THE INVENTION

The present invention relates to digital clock generators, radio receivers used in devices such as system on a chip integrated circuits, and related methods.

DESCRIPTION OF RELATED ART

Radio receivers can be implemented in integrated circuits that can provide an entire receiver front end on a single chip. One concern in the design of these circuits is the amount of noise that is produced. When implemented in a radio receiver, it is desirable for the noise of these circuits to be as low as possible. Digital circuit designs can reduce the amount of analog noise, such as thermal noise that is introduced. However, other sources of noise can be present. The presence of periodic digital switching events and other signals within the frequency band of the input circuitry can cause undesirable spurs from switching events. Digital clocks and their harmonics also produce tones that can degrade performance in the analog circuitry.

The need exists for a low noise radio receiver that can be implemented efficiently on an integrated circuit with digital components.

DETAILED DESCRIPTION OF THE INVENTION INCLUDING THE PRESENTLY PREFERRED EMBODIMENTS

The embodiments of the present invention yield several advantages over the prior art. A digital clock generator spreads the computations performed by one or more circuit modules over a predetermined period in order to reduce the noise caused by periodic bursts of computations that have an unbalanced temporal distribution of energy in the system.

Figure 1:
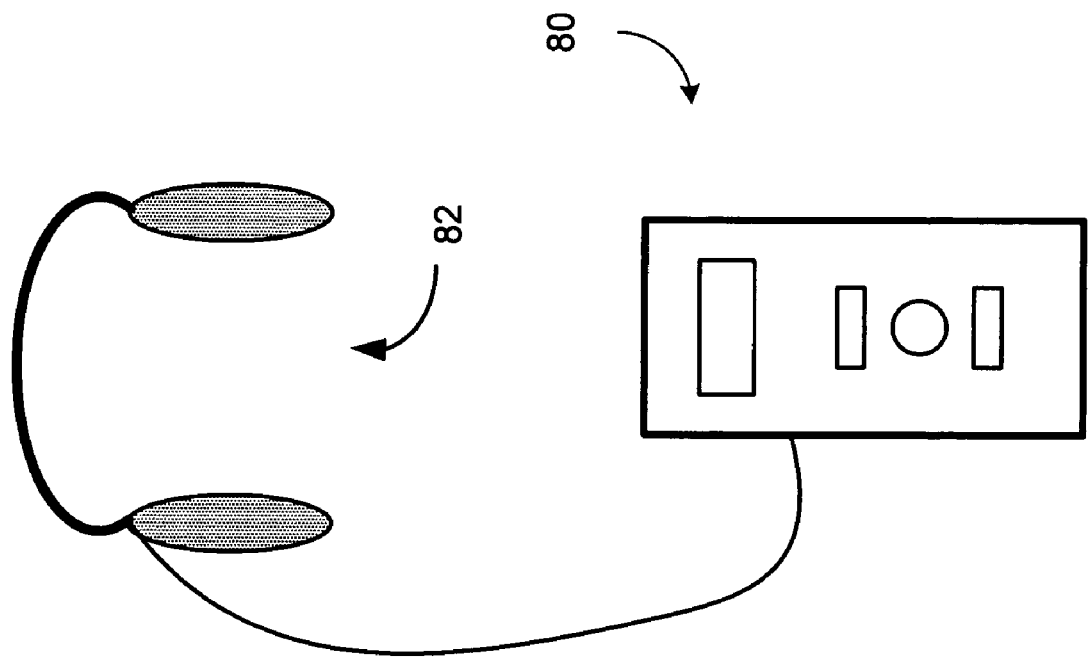
FIG. 1 presents a pictorial diagram of a handheld audio system in accordance with an embodiment of the present invention.

FIG. 1 presents a pictorial diagram of a handheld audio system in accordance with an embodiment of the present invention. In particular, a handheld audio system 80 is shown that receives a radio signal that carries at least one composite audio channel that includes right and left channel stereo audio signals. In an embodiment of the present invention, the radio signal includes one or more of a broadcast frequency modulated (FM) radio signal, an in-band on-channel (IBOC) digital radio signal, a Bluetooth signal, a broadcast amplitude modulated (AM) radio signal, a broadcast satellite radio signal, and a broadcast cable signal.

In operation, the handheld audio system 80 produces an audio output for a user by means of headphones 82 or other speaker systems. In addition to producing an audio output from the received radio signal, the handheld audio system 80 can optionally process stored MP3 files, stored WMA files, and/or other stored digital audio files to produce an audio output for the user. The handheld audio system may also include video features as well. Handheld audio system 80 includes a radio receiver and/or one or more integrated circuits (ICs) that implement the features and functions in accordance with one or more embodiments of the present invention that are discussed herein.

Figure 2:
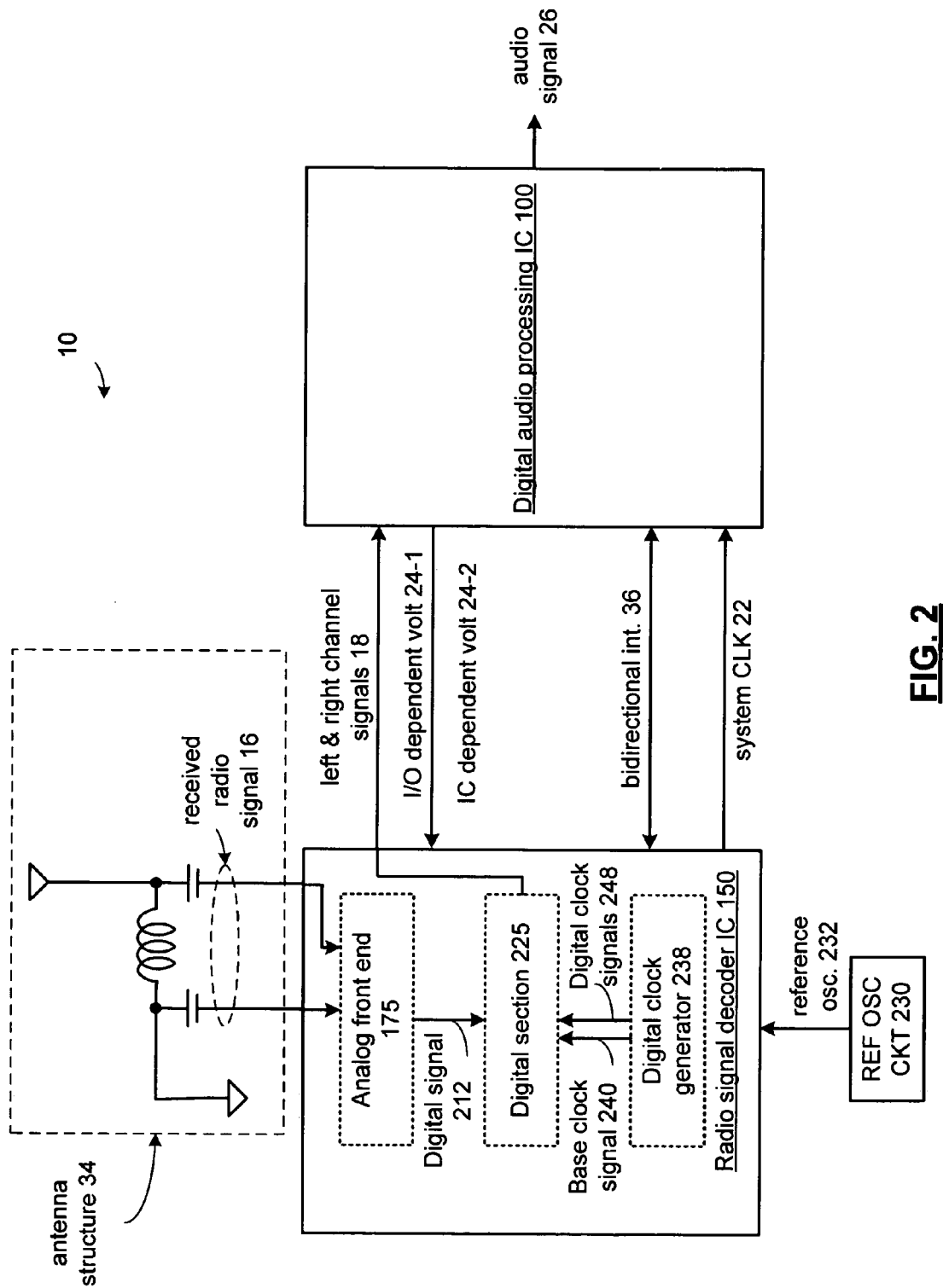
FIG. 2 presents a schematic block diagram of a radio receiver in accordance with an embodiment of the present invention.

FIG. 2 presents a schematic block diagram of a radio receiver in accordance with an embodiment of the present invention. In particular, radio receiver 10 is presented that includes a radio signal decoder integrated circuit 150 that includes an analog front end 175, digital clock generator 238, digital section 225 and/or corresponding methods in accordance with FIGS. 3-14, and a digital audio processing integrated circuit 100. In this embodiment, the radio signal decoder integrated circuit 150 is operably coupled to a reference oscillator circuit 230 and an antenna structure 34. The reference oscillation circuit 230 is operably coupled to a crystal and produces therefrom a reference oscillation 232 and a system clock 22 that is provided to digital audio processing IC 100.

The antenna structure 34 includes an antenna, a plurality of capacitors and an inductor coupled as shown. The received radio signal 16 is provided from the antenna structure 34 to the radio signal decoder integrated circuit 150. The radio signal decoder integrated circuit 150 converts the received radio signal 16 into left and right channel signals 18. In an embodiment of the present invention, the received radio signal 16 is a broadcast frequency modulated radio signal, an IBOC digital radio signal, a Bluetooth radio signal, a broadcast amplitude modulated radio signal, a broadcast satellite radio signal or a broadcast cable signal.

The digital audio processing integrated circuit 100, via a DC-DC converter, generates an input/output (I/O) dependent supply voltage 24-1 and an integrated circuit (IC) dependent voltage 24-2 that are supplied to the radio signal decoder IC 150. In one embodiment, the I/O dependent voltage 24-1 is dependent on the supply voltage required for input/output interfacing of the radio signal decoder IC and/or the digital audio processing IC 14 (e.g., 3.3 volts) and the IC dependent voltage 24-2 is dependent on the IC process technology used to produce integrated circuits 150 and 100. The digital audio processing integrated circuit 100 further includes a processing module that may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. Further note that, the memory stores, and the processing module executes, operational instructions corresponding to at least some of the steps and/or functions illustrated in the Figures that follow.

The interface between the integrated circuits 150 and 100 further includes a bi-directional interface 36. Such an interface may be a serial interface for the integrated circuits 150 and 100 to exchange control data and/or other type of data. In one embodiment, the bi-directional interface 36 may be one or more serial communication paths that are in accordance with the I$^2$C serial transmission protocol. As one or ordinary skill in the art will appreciate, other serial transmission protocols may be used for the bi-directional interface 36 and the bi-directional interface 36 may include one or more serial transmission paths.

In an embodiment of the present invention, radio signal decoder IC 150 is a system on a chip integrated circuit that operates as follows. Analog front end 175 receives received radio signal 16 having a plurality of channel signals, each of the plurality of channel signals being modulated at one of a corresponding plurality of carrier frequencies. Analog front end 175 is operable to convert a selected one of the plurality of channel signals into a digital signal 212. Digital clock generator 238 generates a base clock signal 240 at a base clock frequency that varies based on the selected one of the plurality of channel signals and at least one secondary clock signal having a substantially constant number of secondary clock cycles over a predetermined period. Digital section 225 is operably coupled to the analog front end 175, and converts the digital signal 212 into at least one audio signal, such as left and right channel signals 18, that correspond to the selected one of the plurality of channels. In an embodiment of the present invention, the digital section has a first module that operates based on the base clock signal 212, and a second module that operates based on the at least one secondary clock signal 248.

In an embodiment of the present invention, the digital clock generator spreads the substantially constant number of clock cycles substantially uniformly over the predetermined period. This spreading of the clock cycles can serve to distribute the power consumed by the second module, reducing the noise that may be otherwise produced by the circuit.

Figure 3:
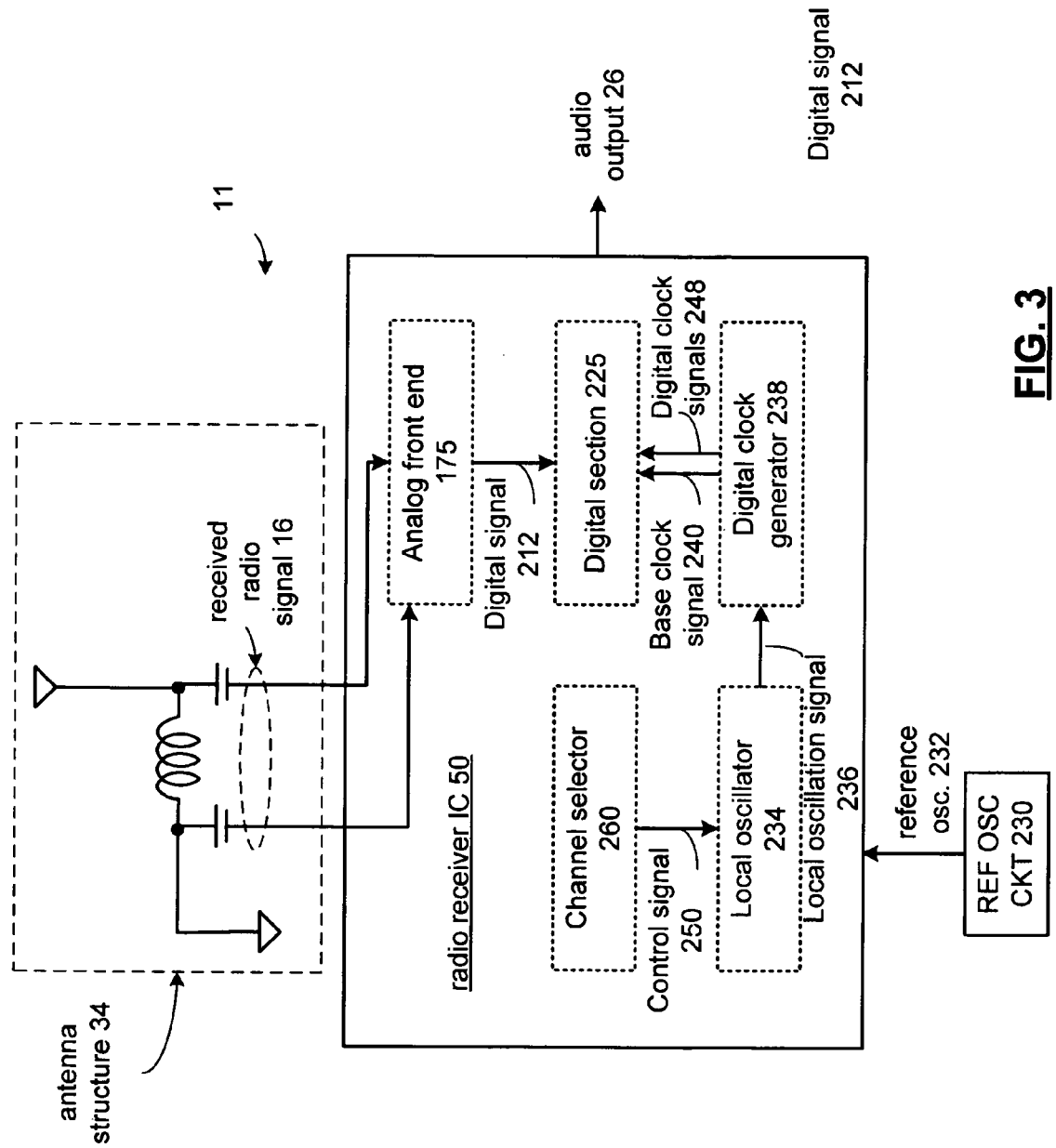
FIG. 3 presents a schematic block diagram of a radio receiver in accordance with an alternative embodiment of the present invention.

FIG. 3 presents a schematic block diagram of a radio receiver in accordance with an alternative embodiment of the present invention. In particular, a schematic block diagram of a radio receiver 11 is presented that includes the functionality of radio receiver 10 presented in an alternative system on a chip configuration. In this embodiment, the functionality of radio signal decoder IC 150 and digital audio processing IC 100 are incorporated into a single integrated circuit, radio receiver IC 50. In particular, radio receiver IC 50 includes analog front end 175, digital clock generator 238, as described in conjunction with FIG. 2. In addition, a channel selector 260, produces a control signal 250 that corresponds to the selected one of the plurality of channels. A local oscillator 234 is operably coupled to the analog front end 175 and a reference oscillation 232, for generating a local oscillation signal 236 based on the control signal 250. In this fashion, as the selected channel is changed to a new channel, the base clock frequency is controlled so as to continue an advantageous relationship between the base clock frequency and the new carrier frequency as is described below. In operation, handheld audio system 11 implements one or more of the features and functions of other embodiments of the present invention described in conjunction with FIGS. 1-14.

In an embodiment of the present invention, the base clock frequency, and the harmonics that are created at integer multiples of the base clock frequency, are not substantially equal to the carrier frequency of the selected one of the plurality of channel signals. Choosing the base clock frequency in this fashion avoids a situation where either the fundamental or one of the harmonics of the base clock signal 212 is equal to the carrier frequency of the selected channel. If one of these signals had a frequency that was substantially equal to the carrier frequency, it could also lead to portions of the base clock signal 240 being introduced into the input of the analog front end 175, interfere with processing of the received radio signal 16 and could show up as undesired tones in one or more portions of radio receiver IC 50.

In addition to the configurations shown in FIG. 2 and FIG. 3, other configurations that include one or more integrated circuits are likewise possible. The broad scope of the present invention includes other partitioning of the various elements of radio receiver 11 into one or more integrated circuits.

Figure 4:
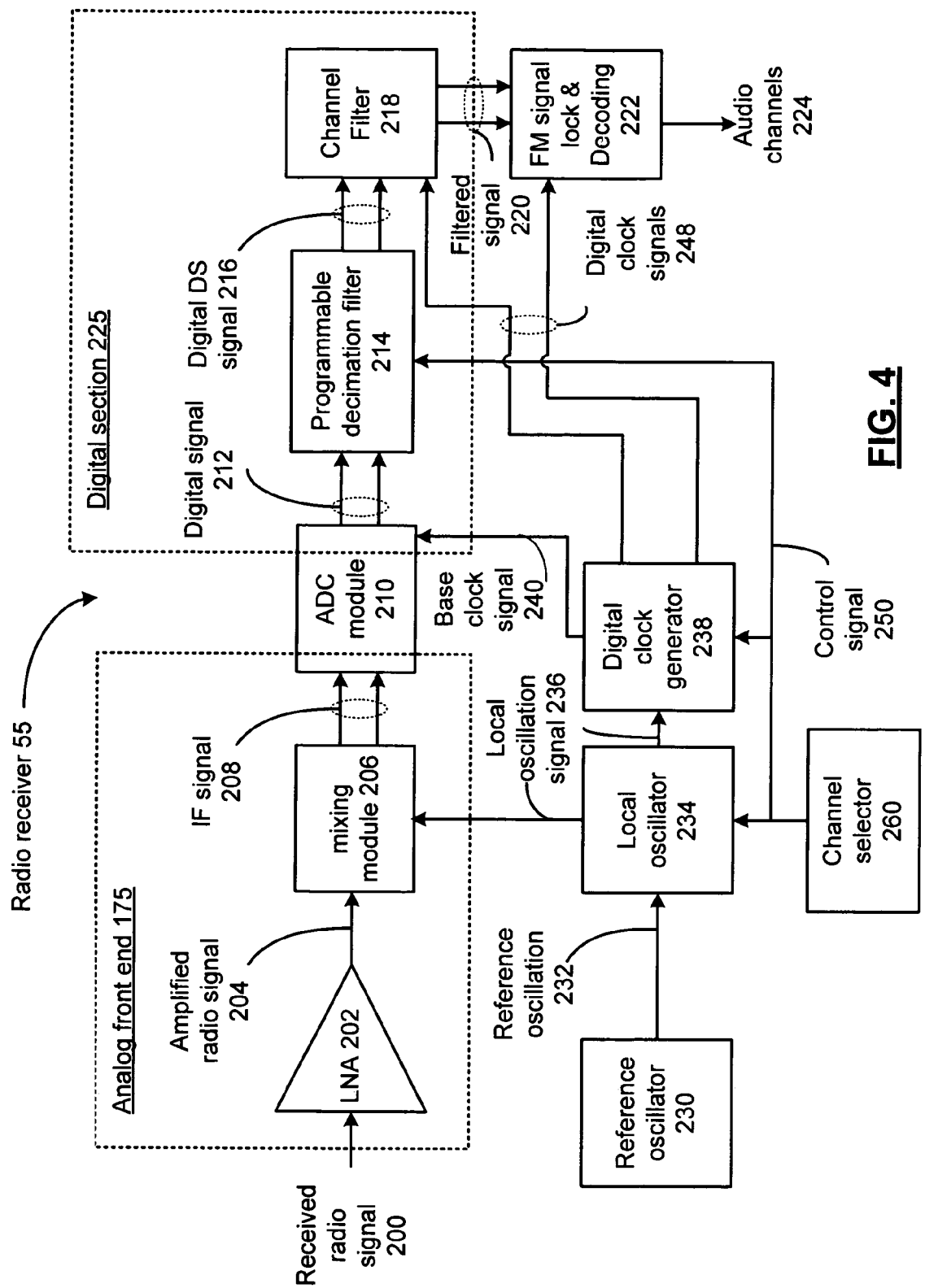
FIG. 4 presents a combination block diagram and schematic diagram of a radio receiver in accordance with an embodiment of the present invention.

FIG. 4 presents a combination block diagram and schematic diagram of a radio receiver in accordance with an embodiment of the present invention. In particular, a radio receiver 55 receives a received radio signal 200 that includes a plurality of broadcast FM channel signals, each of the plurality of channel signals being modulated at one of a corresponding plurality of carrier frequencies. Reference oscillator 230 produces a reference oscillation 232 that is transformed by local oscillator 234 into a local oscillation signal 236 at a local oscillation frequency. A channel selector 260 produces control signal 250 that selects the local oscillation frequency for local oscillator 234 corresponding to a selection of one of the plurality of channels. In an embodiment of the present invention, local oscillator 234 includes a phase locked loop circuit for generating a selected local oscillation frequency based on the selected one of the plurality of channels.

Low noise amplifier 202 produces a amplified radio signal 204 that is sampled and mixed with the local oscillation signal 236 by mixing module 206 to form a discrete time IF signal 208 at an intermediate frequency. In a preferred embodiment of the present invention, the gain at which the low noise amplifier 202 amplifies the receive signal 200 is dependent on the magnitude of the received radio signal 200 and an automatic gain control circuit. Note that IF signal 208 is a modulated signal and if the local oscillation signal 236 has an effective frequency (when considering the sample rate) that matches the frequency of the selected channel, the IF signal 208 will have a carrier frequency of approximately zero. If the local oscillation signal 236 has an effective frequency that is not equal to the carrier frequency of received radio signal 200, then the IF signal 208 will have a carrier frequency based on the difference between the carrier frequency of the selected channel and the effective frequency of local oscillation 236. In such a situation, the carrier frequency of the IF signal 208 may range from 0 hertz to one megahertz or more.

Analog to digital converter (ADC) module 210 converts the IF signal 208 into a digital signal 212, based on clock signal 240. As noted above, digital signal 212 may or may not be down-converted to baseband. Programmable decimation filter 214 converts the digital signal 212 into a digital downsampled (DS) signal 216, in response to control signal 250. Base clock signal 240 is a variable frequency clock and varies as a function of local oscillation signal 236. As base clock signal 240 is adjusted to convert analog data to digital data at various rates, programmable decimation filter 214 adjusts to produce digital downsampled signal 216 at a roughly constant output rate so that channel filter 218, a digital filter that provides channel separation and produces filtered signal 220, can employ constant coefficients and can operate based on a secondary clock signal 248 that has a substantially constant number of clock signals over a predetermined period. FM signal lock and decoding module 222, tracks the FM signal via the 19 kHz pilot signal and produces audio channel signals 224, such as left and right channel signals 18, also based on a secondary clock signal 248.

In a preferred embodiment of the present invention, the IF signal 208, digital signal 212, digital downsampled signal 216 and filtered signal 220 each include an in-phase signal and a quadrature-phase signal forming parallel signal paths through these portions of radio receiver 55. While the description above includes a programmable decimation filter that adjusts with the base clock frequency, other implementations are likewise possible, including a fixed decimation filter and variable channel filter, etc., within the broad scope of the present invention.

Consider the operation of the radio receiver 55 in light of the following example. In this example, received radio signal 200 is a frequency modulated (FM) broadcast signal that includes a plurality of channels that are spaced 200 kHz apart in the range of 76 MHz to 108 MHz. Consider further a selected channel to be received that operates at a carrier frequency of 100 MHz. Channel selector 260 generates a control signal 250 that includes a 7 bit signal that commands local oscillator 234 to produce a 400 MHz local oscillation signal 236 from reference oscillation 232.

Low noise amplifier 202 amplifies and passes the entire 76 MHz-108 MHz broadcast band as amplified radio signal 200. Mixing module 206 samples the amplified radio signal 204 at 100 MHz, down converts and filters the output to produce an IF signal 208, at or near baseband, having a 200 kHz bandwidth, corresponding to the broadcast FM channel whose carrier frequency was 100 MHz. ADC module 210 converts the IF signal 208 into a digital signal 212 based on a base clock signal 240 having a frequency of 66.67 MHz, that is formed by dividing the local oscillator signal by a factor D=6, producing a frequency that is substantially equal to $\frac{2}{3}$ of the carrier frequency of the received signal. Harmonics of the base clock signal appear at 133.33 MHz, 200 MHz, 266.67 MHz, . . . , all at frequencies that are spaced from the 100 MHz carrier frequency so as to reduce harmful interference.

Figure 5:
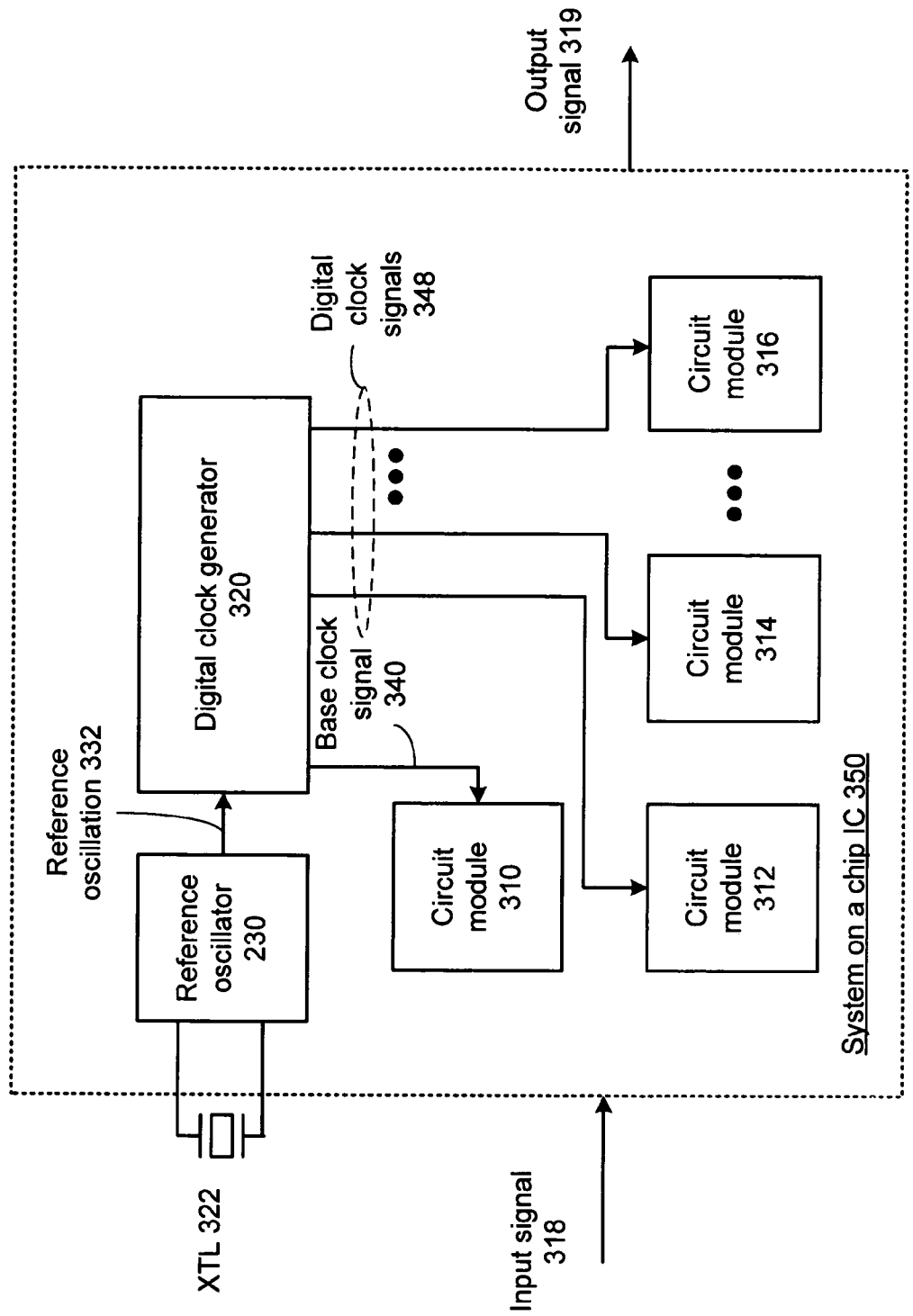
FIG. 5 presents a block diagram of a system on a chip integrated circuit in accordance with an embodiment of the present invention.

FIG. 5 presents a block diagram of a system on a chip integrated circuit in accordance with an embodiment of the present invention. In particular, system on a chip integrated circuit 350 includes circuit modules 310, 312, 314, and 316 that are operable to produce at least one output signal 319 based on at least one input signal 318. As will be discussed in conjunction with FIGS. 6-7, system on a chip integrated circuit 350 can implement any of a wide range of functions performed by electronic devices.

Reference oscillator 230 generates a reference oscillation 332 based on crystal 322. Digital clock generator 320 generates a base clock signal 340 for circuit module 310 at a variable base clock frequency and for generating at least one secondary clock signal 348 having a substantially constant number of secondary clock cycles over a predetermined period for circuit modules 312, 314 and 316.

Figure 6:
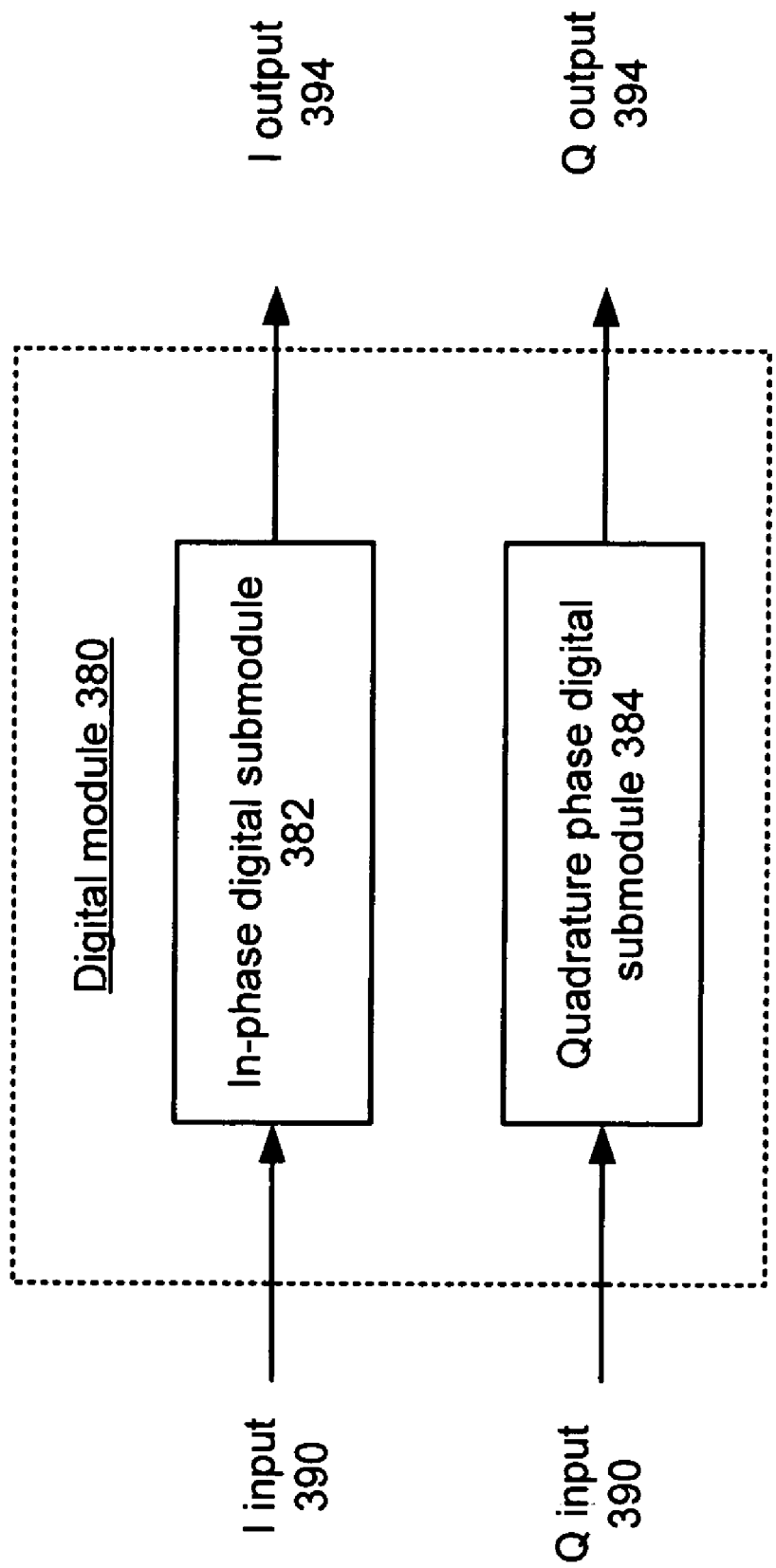
FIG. 6 presents a block diagram representation of a digital module in accordance with an embodiment of the present invention.

FIG. 6 presents a block diagram representation of a digital module in accordance with an embodiment of the present invention. In particular, a digital module 380 is presented that can be used in conjunction with FIGS. 1-5 to process signals such as mixed signals over an in-phase signal path and a quadrature phase signal path. Digital module 380 includes an in-phase digital submodule 382 that processes an in-phase (I) input 390 to produce an I output 394. In addition, digital module 380 includes a quadrature phase digital submodule 384 that processes a quadrature phase (Q) input to produce a Q output 394.

In an embodiment of the present invention, digital module 380 can implement the specific processing and/or functions associated with circuit modules such as programmable decimation filter 214, channel filter 218, circuit modules 310, 312, 314 and/or 316 or a portion thereof. In-phase digital submodule 382 and quadrature phase digital submodule 384 perform identical or corresponding functions on the substantially orthogonal phases of input signal to produce two phases of an output signal.

Figure 8:
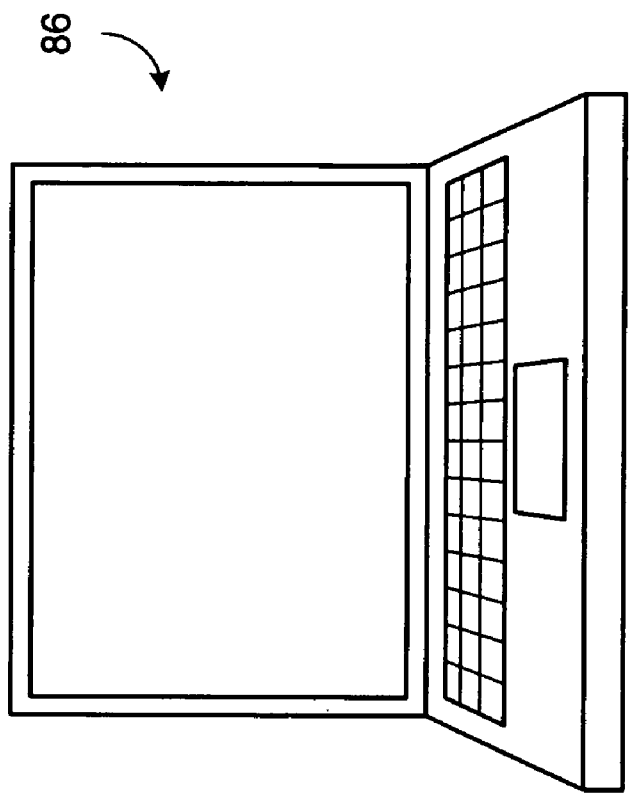
FIG. 7-8 present pictorial diagrams of various devices in accordance with an embodiment of the present invention.
Figure 7:
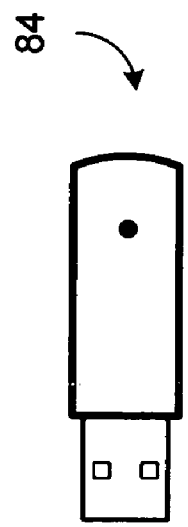

FIG. 7-8 present pictorial diagrams of various devices in accordance with an embodiment of the present invention. While the preceding disclosure has been directed to a digital clock generator 238 used in conjunction with handheld audio system 80, receivers 10 or 11 or system on a chip integrated circuit 350, in an embodiment of the present invention, digital clock generators 238 and/or 320 may be implemented by itself or part of other integrated circuits. While implemented as part of an integrated circuit or as part of a system on a chip integrated circuit, digital clock generators 238 and/or 320 can be used in a wide variety of electronic devices such as universal service bus (USB) device 84, in computer 86, or in a variety of other electronic devices that employ clock signals and circuit modules that utilize clock signals.

Figure 9:
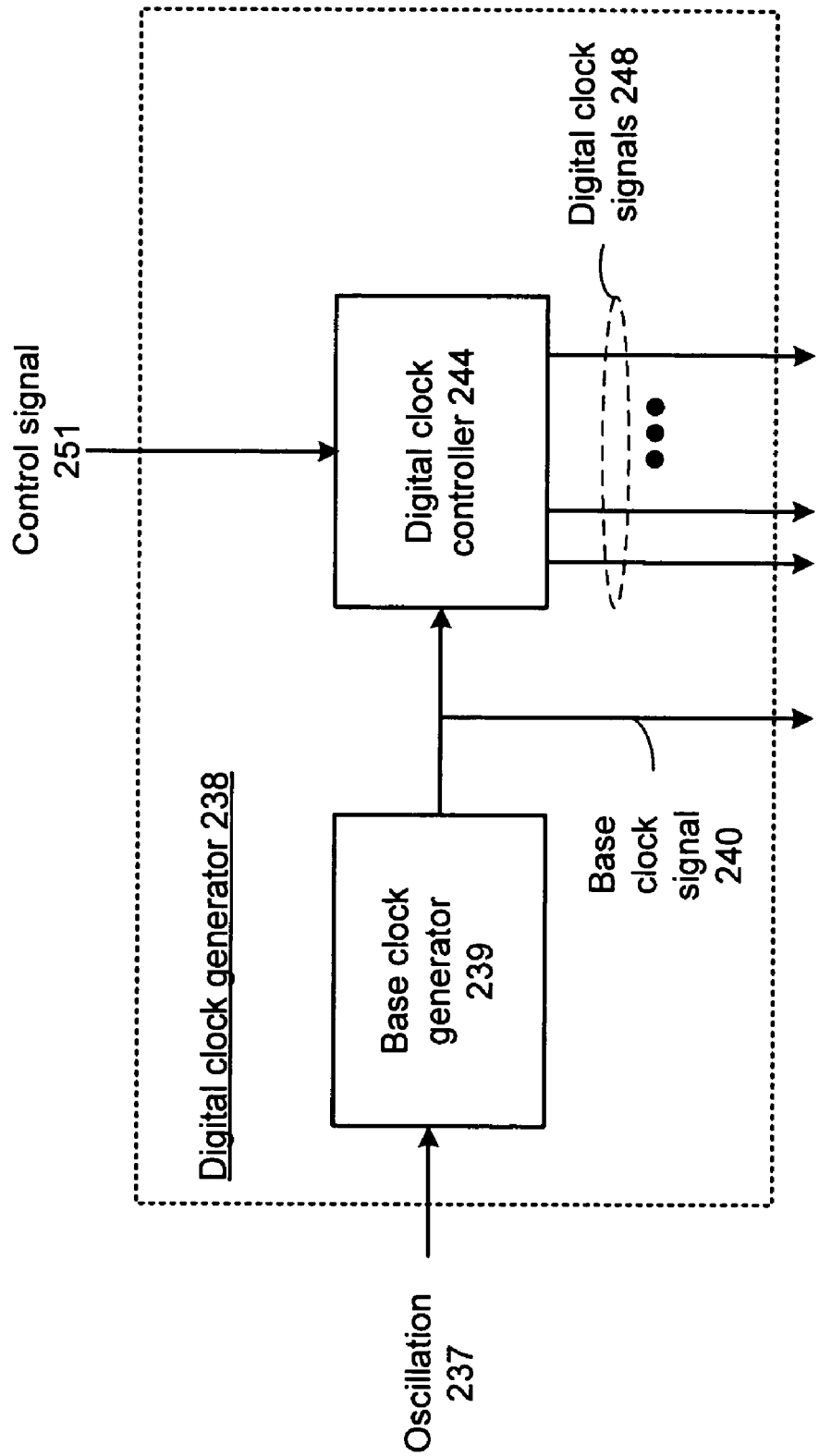
FIG. 9 presents a block diagram representation of a digital clock generator in accordance with an embodiment of the present invention.

FIG. 9 presents a block diagram representation of a digital clock generator in accordance with an embodiment of the present invention. In particular, a digital clock generator 238 is shown that includes base clock generator 239 that receives oscillation 237, such as local oscillation 236, and generates base clock signal 240 therefrom.

While description above describes digital clock generator 238, digital clock generator 320 may likewise be implemented in this fashion, if oscillation 237 includes reference oscillation 332. In an embodiment of the present invention, base clock signal 240 is formed by dividing the oscillation 237 using divider module that divides the frequency of oscillation 237 by a factor, D. In an embodiment of the present invention, D is an integer value and the divider module employs shift registers, flip-flops and/or counters. In an alternative embodiment of the present invention, divider module is implemented using a fractional divider that allows D to be a mixed number with both an integer and factional component, as will be evident to one of ordinary skill in the art based on the teachings disclosed herein. Also, a phase locked loop circuit could be used to multiply up by N, and divide by M, to achieve a ratio of integers to implement D.

Digital clock controller 244 converts base clock signal 240 into digital clock signals 248 based on control signal 251.

When used in conjunction with the embodiments of FIG. 4, clock signal 240 is a divided version of local oscillation 236. As base clock signal 240 varies, as the frequency of local oscillation 236 varies, with the selection of different radio channels. However, control signal 251 can be implemented with control signal 250 that controls the local oscillator 232 to tune the analog front end 175 to a particular channel. Control signal 250 includes a 4-bit signal that ranges from N=32 to N=48. In further examples, corresponding to the selection of other FM broadcast channels, higher frequency channels require higher local oscillator frequencies and correspondingly higher frequencies for base clock signal 240, and higher selected down sampling factors for programmable decimation filter 214. Selection of a FM channel of in the range of say 99.1-101.1 MHz could like use down sampling factor N=40, however, selection of channel frequency of 102.1 MHz could use a down sampling factor N=41, in order to control the sample frequency of digital downsampled signal 216 to a relatively constant range. In this example, digitally downsampled signal 216 will be constant with approximately a 2% tolerance. The use of a 4-bits of control signal to select the value of N, allows for 16 different values. In a preferred embodiment of the present invention, N In alternative embodiments of the present invention, an arbitrary range of N could likewise be used with a corresponding number of bits as will be understood by one skilled in the art, based on the teachings presented herein.

Figure 10:
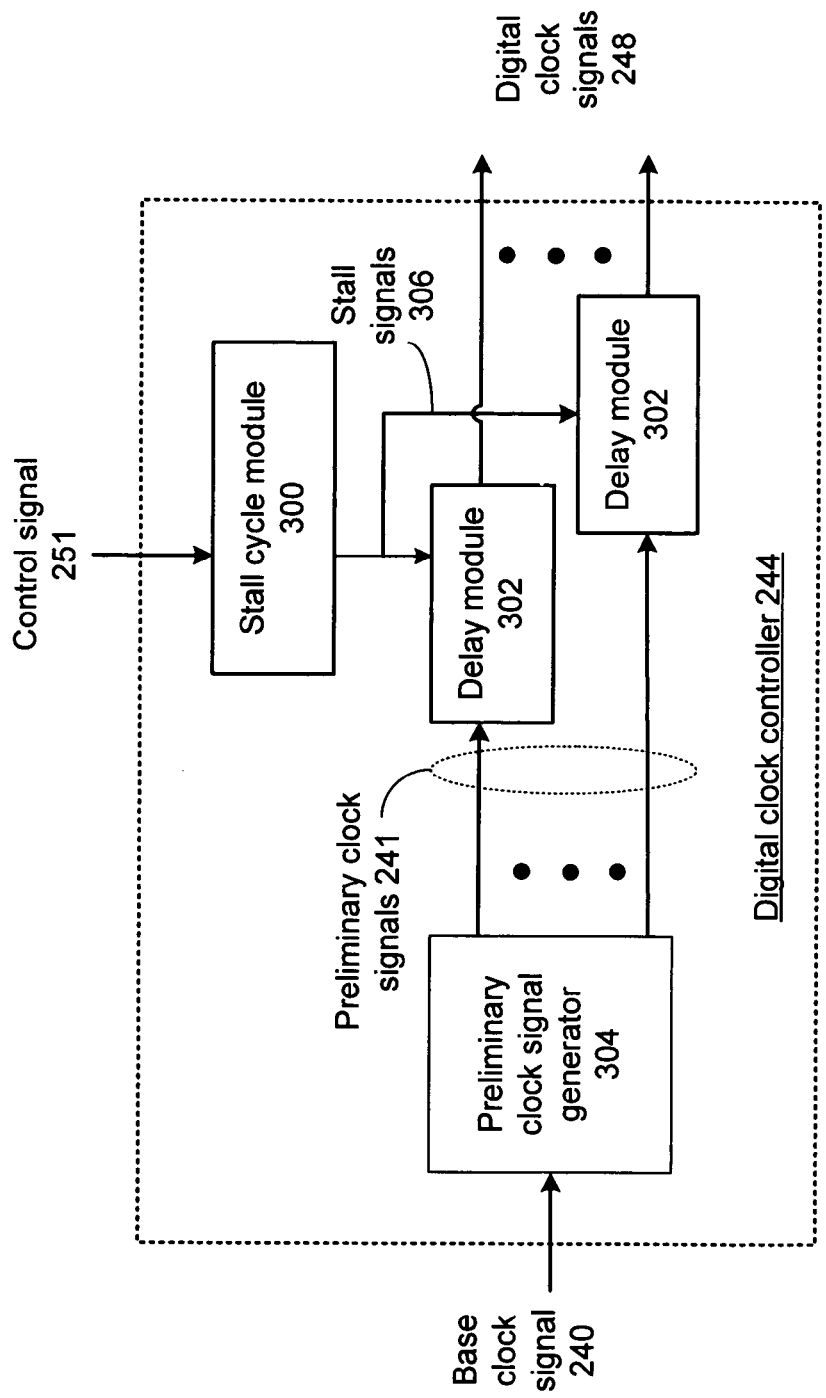
FIG. 10 presents a block diagram representation of a digital clock controller in accordance with an embodiment of the present invention.

FIG. 10 presents a block diagram representation of a digital clock controller in accordance with an embodiment of the present invention. In particular, digital clock controller 244 includes a preliminary clock signal generator 304 that generates one or more preliminary clock signals 241 from base clock signal 240. In an embodiment of the present invention, preliminary clock signal generator 304 generates a plurality of unique clock signals for triggering the computations performed by a corresponding plurality of circuit modules, such as digital modules, when the base clock signal 240 is at its lowest frequency. When the frequency of base clock signal 240 increases, stall cycle module 300, in cooperation with delay modules 302, is operable to insert stall cycles in the preliminary clock signals 241 so that digital clock signals 248 maintain a substantially constant number of clock cycles over the predetermined period. In an embodiment of the present invention, delay modules 302 are triggered by stall signals 306 to produce delays in preliminary clock signals 241 having a duration of a single clock cycle of the base clock signal 240 each time that the stall signals are asserted. In an alternative embodiment of the present invention, delay modules 302 produce a delays that are based on the pulse duration of the corresponding stall signal.

In an embodiment of the present invention, base clock signal 240 has 32 clock cycles during a predetermined period, and further control signal 251 has a value of 0000 corresponding to N=32. As the base clock frequency is increased, such that base clock signal 240 has 33 clock cycles during a predetermined period (control signal 251=0001 and N=33), stall cycle module 300 maintains a substantially constant number of clock cycles during the predetermined period for the digital clock signals 248 by generating one or more stall signals 306 in response to the control signal 251 and by controlling delay modules 302 to insert a delay in the preliminary clock signals 241 having a duration of at least one stall cycle. As the base clock frequency is increased, such that base clock signal 240 has 40 clock cycles during a predetermined period (control signal 251=1000 and N=40), stall cycle module 300 maintains a substantially constant number of clock cycles in digital clock signals 248 during the predetermined period by inserting eight stall cycles during the predetermined period.

In operation in accordance with an embodiment of the present invention, stall cycle module selectively asserts and de-asserts stall signals 306 in order to distribute the cycles of preliminary clock signals 241 over the predetermined period, to distribute (such as to substantially evenly distribute) the power consumed by the module that is driven by the digital clock signal 248 over the predetermined period and to reduce the resultant voltage noise on power and ground that is produced by the operation of the blocks clocked by digital clock signals 248.

In an embodiment of the present invention the stall cycle module 300 and preliminary clock signal generator 304 are implemented using a processing module that may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry.

When used in conjunction with the embodiment of the present invention described in conjunction with FIG. 4, the predetermined period is a computational period of one or more modules of the device, such as a fraction of a sampling period, (such as one-quarter of a sampling period), used in channel filter 218 and FM signal lock and decoding module 222. Provided however, other predetermined periods, such as sampling periods, decimation periods, frame periods, bit periods, pilot tone periods, timing recovery periods or other predetermined periods may be used including whole periods, multiple periods or fractions thereof corresponding to a series of computations that are implemented by the electronic device and particular that may be common to multiple circuit elements of the electronic device. Further, examples are shown in conjunction with FIGS. 11-16 that follow.

Figure 11:
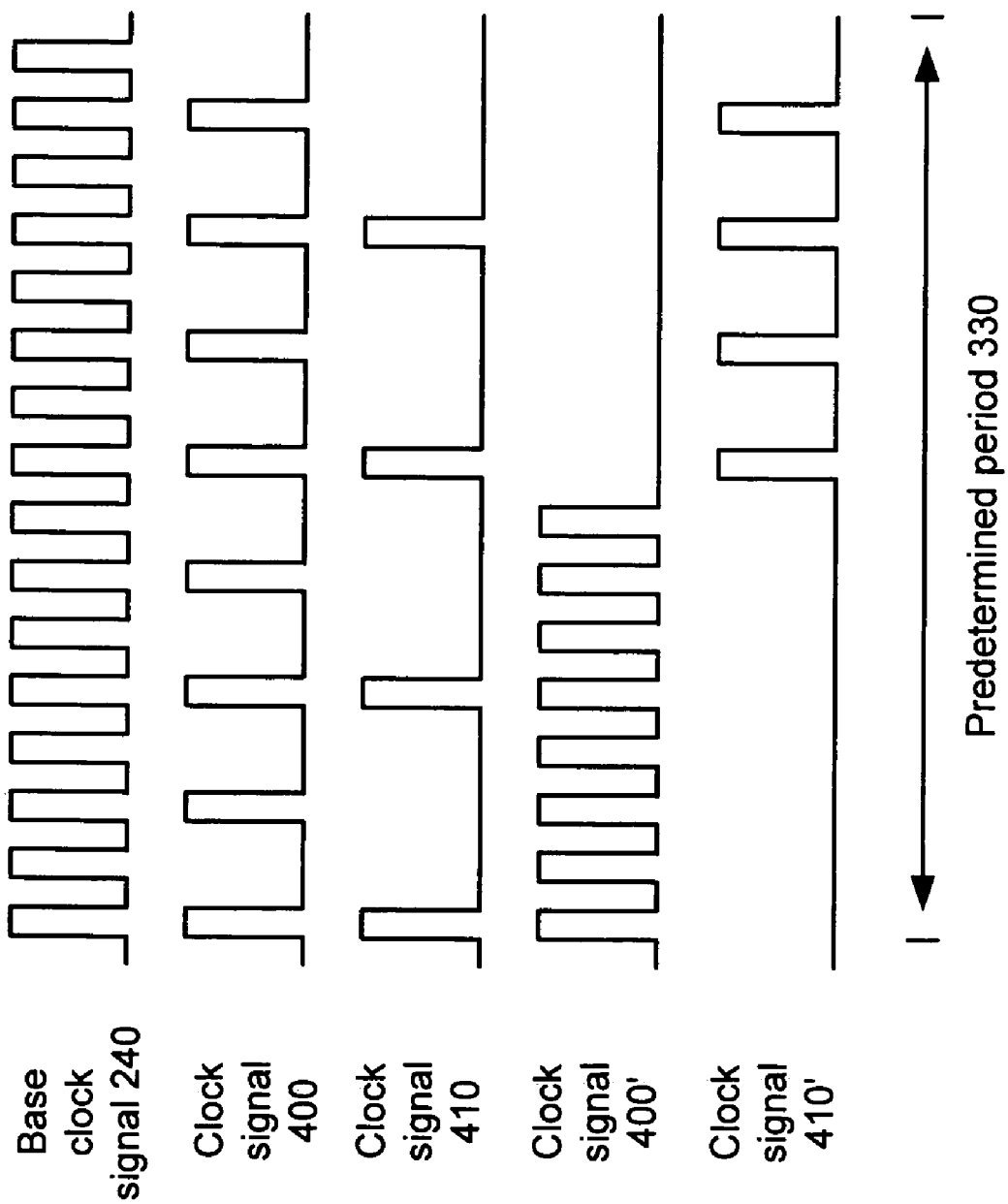
FIG. 11 presents a timing diagram in accordance with an embodiment of the present invention.

FIG. 11 presents a timing diagram in accordance with an embodiment of the present invention. In particular, a predetermined period 330 is shown that corresponds to sixteen cycles of base clock signal 240 that, for the sake of illustration, is the lowest frequency of the base clock signal 240 and the lowest value of control signal 251. Clock signal 400 and clock signal 410 represent preliminary clock signals 241 that correspond to two digital modules. In this embodiment, no stall cycles (no delays) are inserted and the digital clock signals 248 are directly the preliminary clock signals 241.

In this embodiment of the present invention, the preliminary clock signals 241 each begin with a clock cycles that are in synchronism to indicate the beginning of the predetermined period 330. Preliminary clock signals have an unequal number of clock cycles (four and eight) that are each distributed substantially uniformly over the predetermined period.

In an embodiment of the present invention, clock signal 400 is supplied to a first digital module and clock signal 410 is supplied to a second digital module that are configured in a pipeline configuration such that the input of the second digital module during the predetermined period 330 is the output of the first digital module generated during a prior predetermined period. If the first and second digital modules have disparate power consumptions, distributing the processing in this fashion can reduce the amount of noise generated at the expense of increased computational pipeline delay, when compared with an alternative configuration presented with clock signals 400' and 410'. In clock signal 401', the processing performed by the first circuit module is grouped in a first part of the predetermined period 330. In clock signal 410' the processing performed by the second digital module is grouped in the remaining part of the predetermined period. Collectively, the clock signals 401' and 410' are spread over the predetermined period, and this embodiment may be advantageous in circumstances where the power consumed by the modules is relatively constant or a pipeline delay is disadvantageous.

Figure 12:
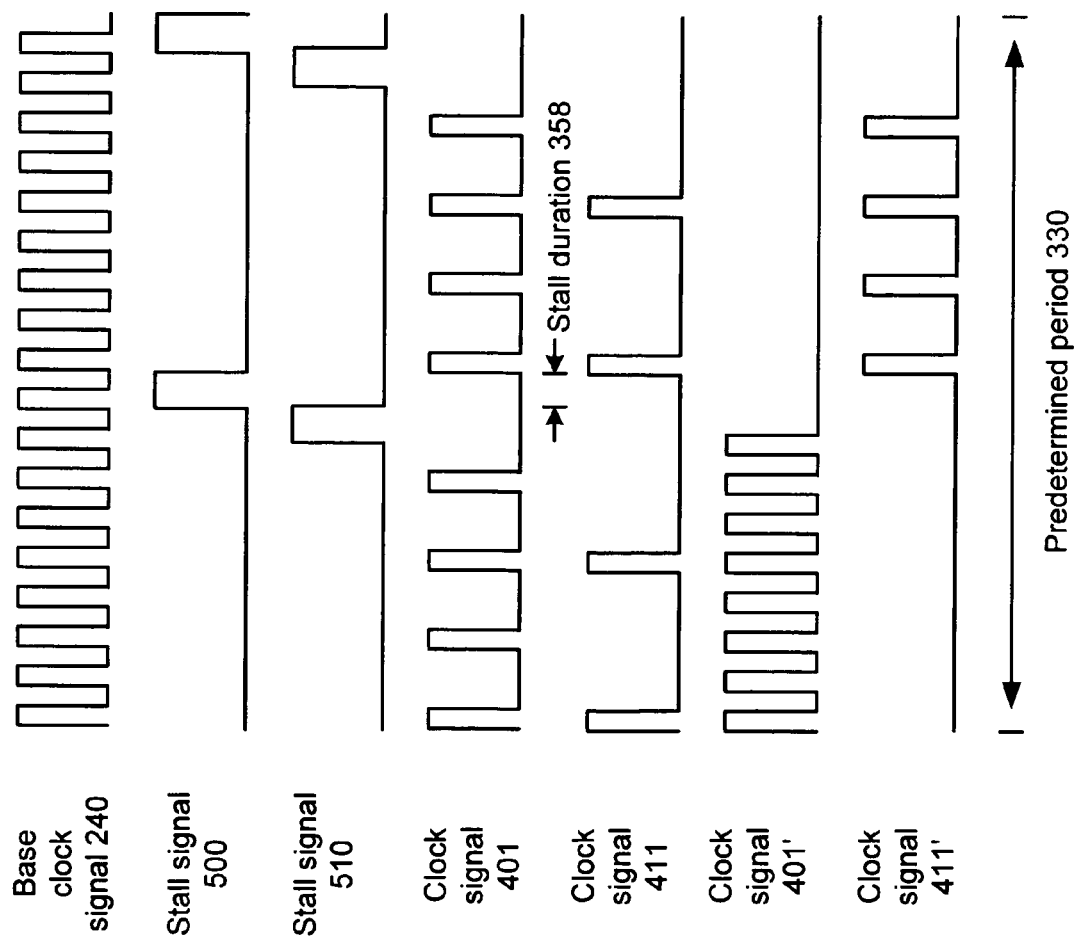
FIG. 12 presents a timing diagram in accordance with an embodiment of the present invention.

FIG. 12 presents a timing diagram in accordance with an embodiment of the present invention. In particular, a predetermined period 330 is shown that corresponds to eighteen cycles of base clock signal 240. In this embodiment of the present invention, stall signals 500 and 510 are generated. Stall signal 500 is asserted at the $9^{th}$ and $18^{th}$ clock cycles. Stall signal 510 is asserted at the $8^{th}$ and $17^{th}$ clock cycles. Stall signal 500 operates to insert two stall cycles in clock signal 400 from FIG. 11 (that is now generated at a higher frequency due to the frequency increase in base clock signal 240) to form clock signals 401 and 401'. Stall signal 510 operates to insert two stall cycles in clock signal 410 from FIG. 11 to form clock signal 411 and 411'. In this fashion, digital clock generator 238 operates to control the clock signals 401 and 411 (or to control the clock signals 401' and 411') to the first and second digital modules to maintain eight and four clock cycles, respectively, during predetermined period 330.

In this embodiment, stall signal 500 is asserted when stall signal 510 is deasserted and stall signal 510 is asserted when stall signal 500 is deasserted. In this arrangement, a situation is possibly avoided whereby all digital modules are delayed simultaneously, guaranteeing a condition where no digital modules are processing at this time. Different arrangements of stall signals are also possible within the scope of the invention.

Figure 13:
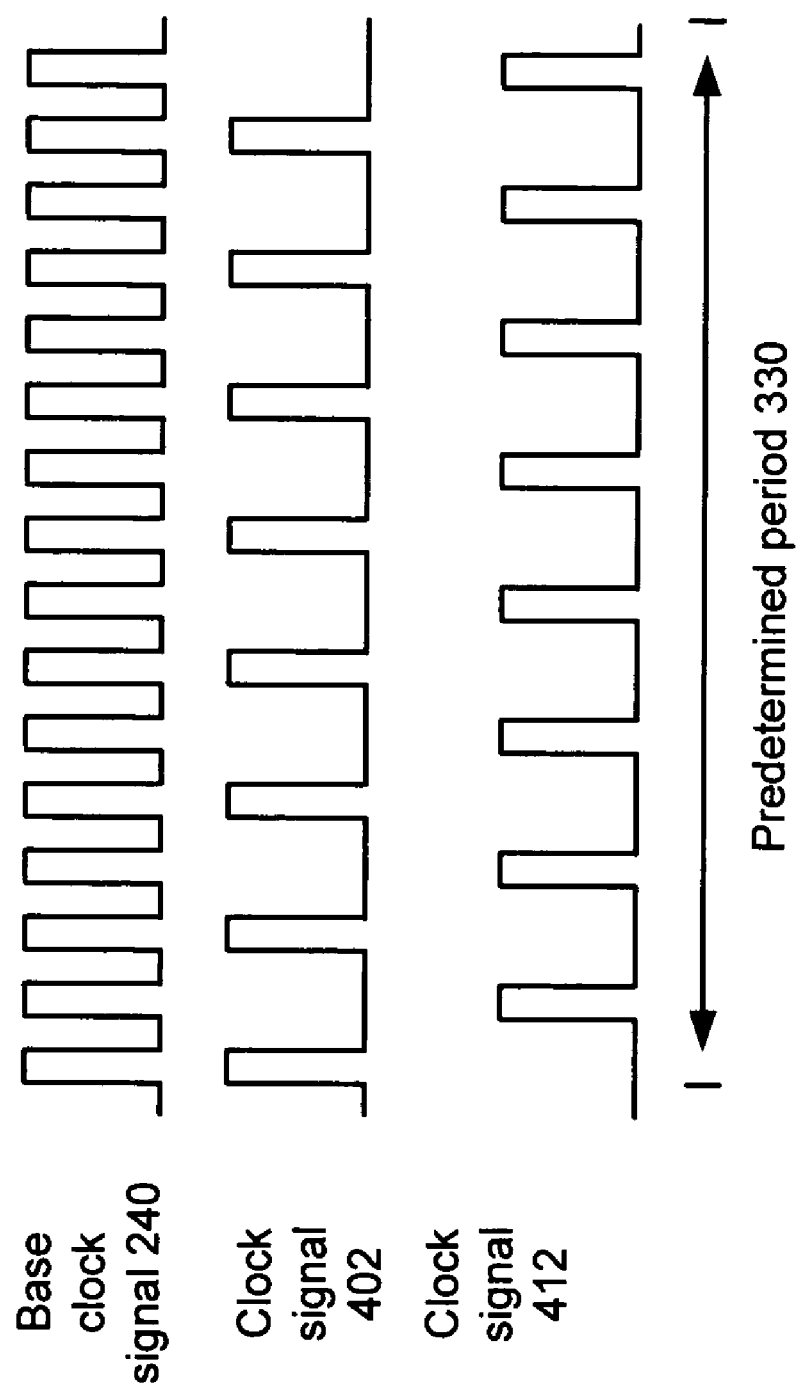
FIG. 13 presents a timing diagram in accordance with an embodiment of the present invention.

FIG. 13 presents a timing diagram in accordance with an embodiment of the present invention. In particular, a predetermined period 330 is shown that corresponds to sixteen cycles of base clock signal 240 that, for the sake of illustration, is the lowest frequency of the base clock signal 240 and the lowest value of control signal 251. Clock signal 402 and clock signal 412 represent preliminary clock signals 241 that correspond to two digital modules. In this embodiment, no stall cycles (no delays) are inserted and the digital clock signals 248 are directly the preliminary clock signals 241.

In this embodiment of the present invention, the preliminary clock signals 241 are shown with a relative time offset from each other, so that the signal 402 and 412 are time shifted from each other by approximately half of the period of signal 402. Preliminary clock signals each have eight clock cycles that are distributed substantially uniformly over the predetermined period. Other advantageous arrangements are possible between clock signal 402 and clock signal 412 such as two pulses from clock signal 402, then two pulses from clock signal 412. Clock signal 402 and 412 should be arranged such that they are substantially non-aligned and cause computations in digital blocks that are time shifted from each other.

In an embodiment of the present invention, clock signal 402 is supplied to a first digital module and clock signal 412 is supplied to a second digital module that can correspond to in-phase and quadrature phase submodules 382 and 384 of a digital module 380. The digital clock cycles of clock signals 402 and 412 are substantially interleaved, wherein digital clock generator 238 substantially alternates between generating digital clock cycles between clock signal 402 and clock signal 412 over the predetermined period 330. While two such clock signals 402 and 412 are shown a greater number of clock signal pairs could likewise be generated for a further digital modules that include I and Q signal paths.

Figure 14:
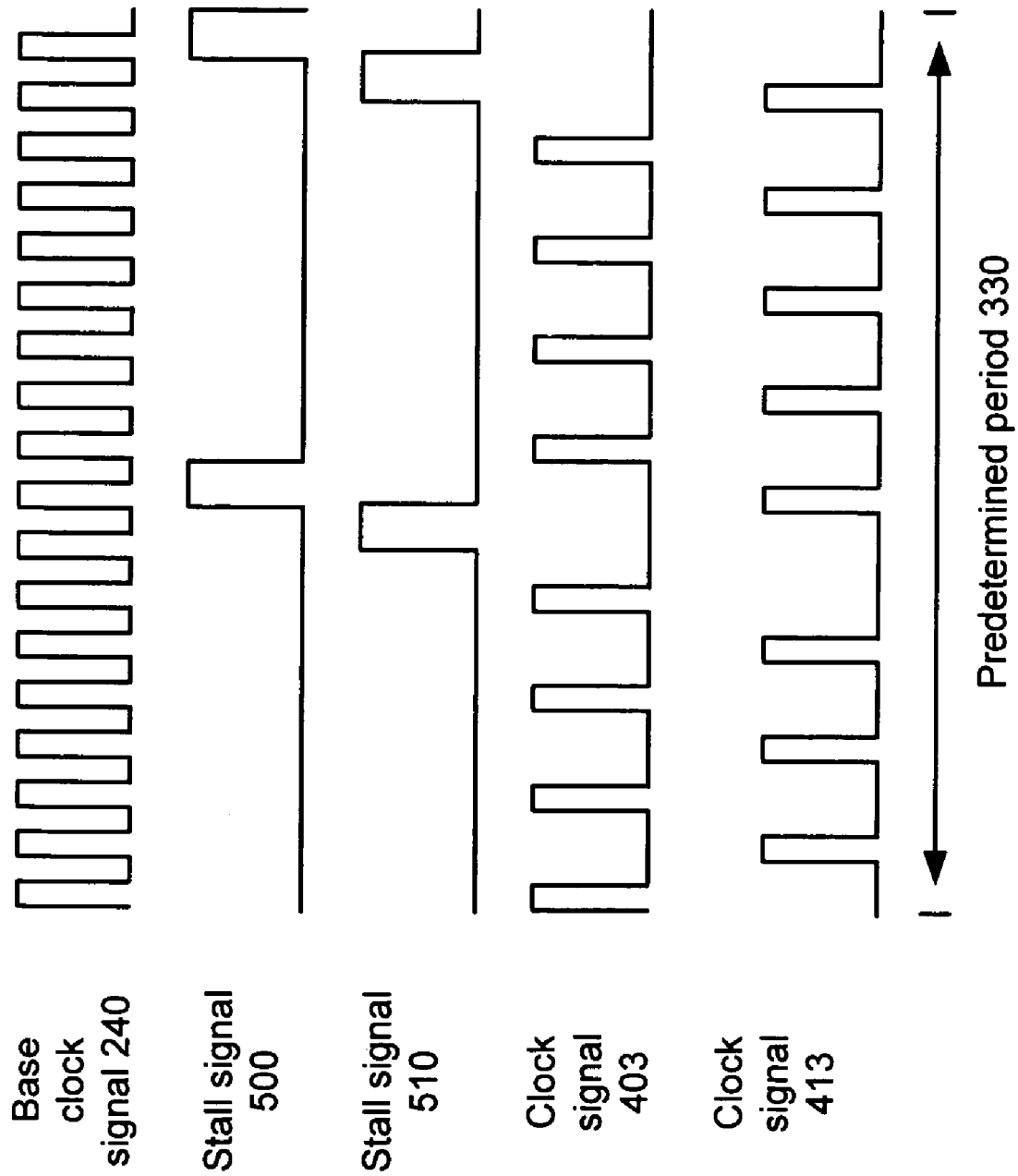
FIG. 14 presents a timing diagram in accordance with an embodiment of the present invention.

FIG. 14 presents a timing diagram in accordance with an embodiment of the present invention. In particular, a predetermined period 330 is shown that corresponds to eighteen cycles of base clock signal 240. In this embodiment of the present invention, stall signals 500 and 510 are generated as presented in conjunction with FIG. 12. Stall signal 500 operates to insert two stall cycles in clock signal 402 (that is now generated at a higher frequency due to the frequency increase in base clock signal 240) to form clock signal 403. Stall signal 510 operates to insert two stall cycles in clock signal 412 to form clock signal 413. In this fashion, digital clock generator 238 operates to control the clock signals 403 and 413 to the first and second digital modules to maintain eight clock cycles during predetermined period 330.

Figure 15:
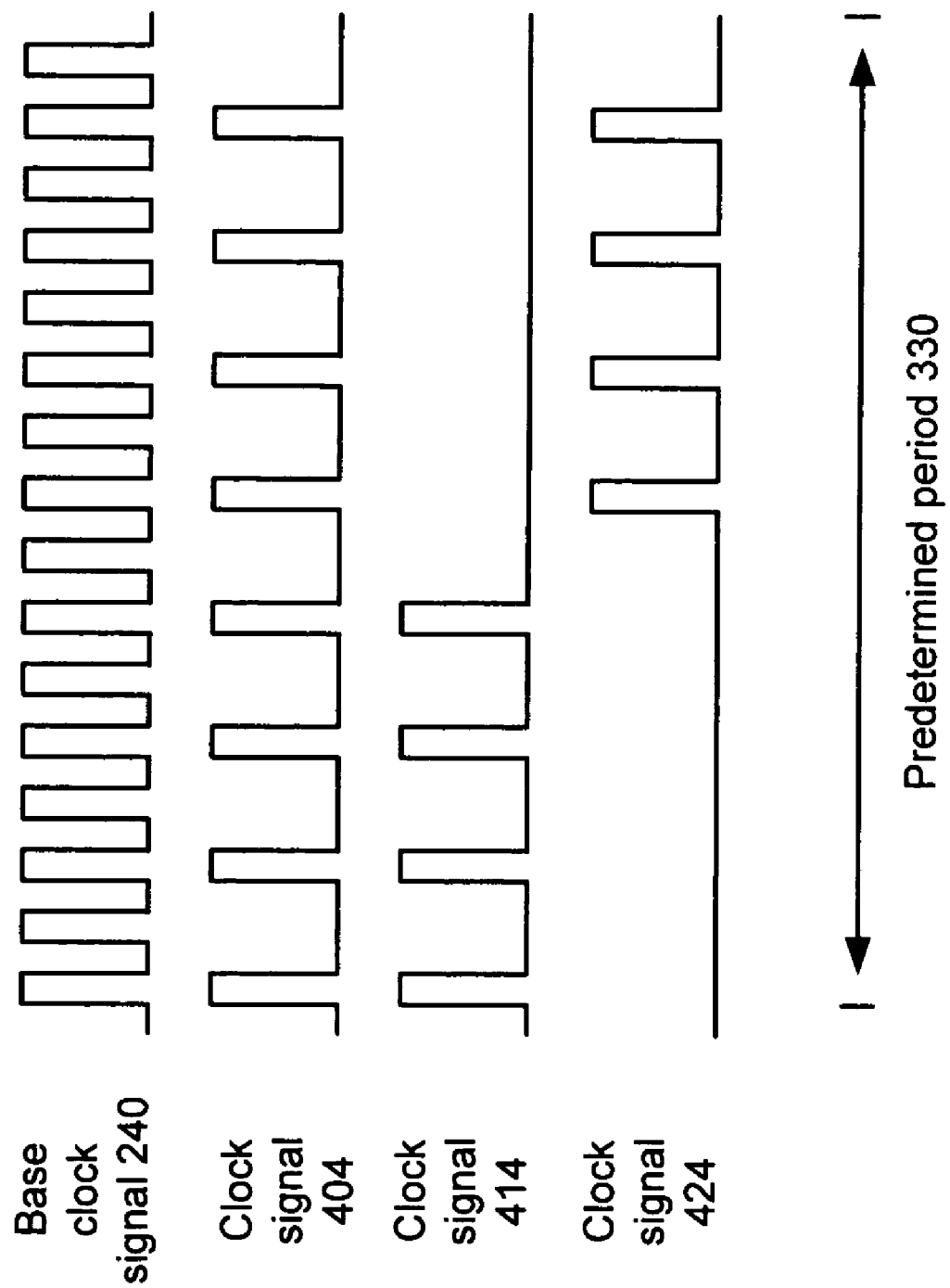
FIG. 15 presents a timing diagram in accordance with an embodiment of the present invention.

FIG. 15 presents a timing diagram in accordance with an embodiment of the present invention. In particular, a predetermined period 330 is shown that corresponds to sixteen cycles of base clock signal 240 that is the lowest frequency of the base clock signal 240 and the lowest value of control signal 251. Clock signal 404, 414 and 424 represent preliminary clock signals 241 that correspond to three digital modules. As in the examples presented in FIGS. 11 and 13, no stall cycles (no delays) are inserted and the digital clock signals 248 are directly the preliminary clock signals 241. In this embodiment, the processing of the modules corresponding to clock signals 414 and 424 are spread over the predetermined period 330 in combination with one another.

Figure 16:
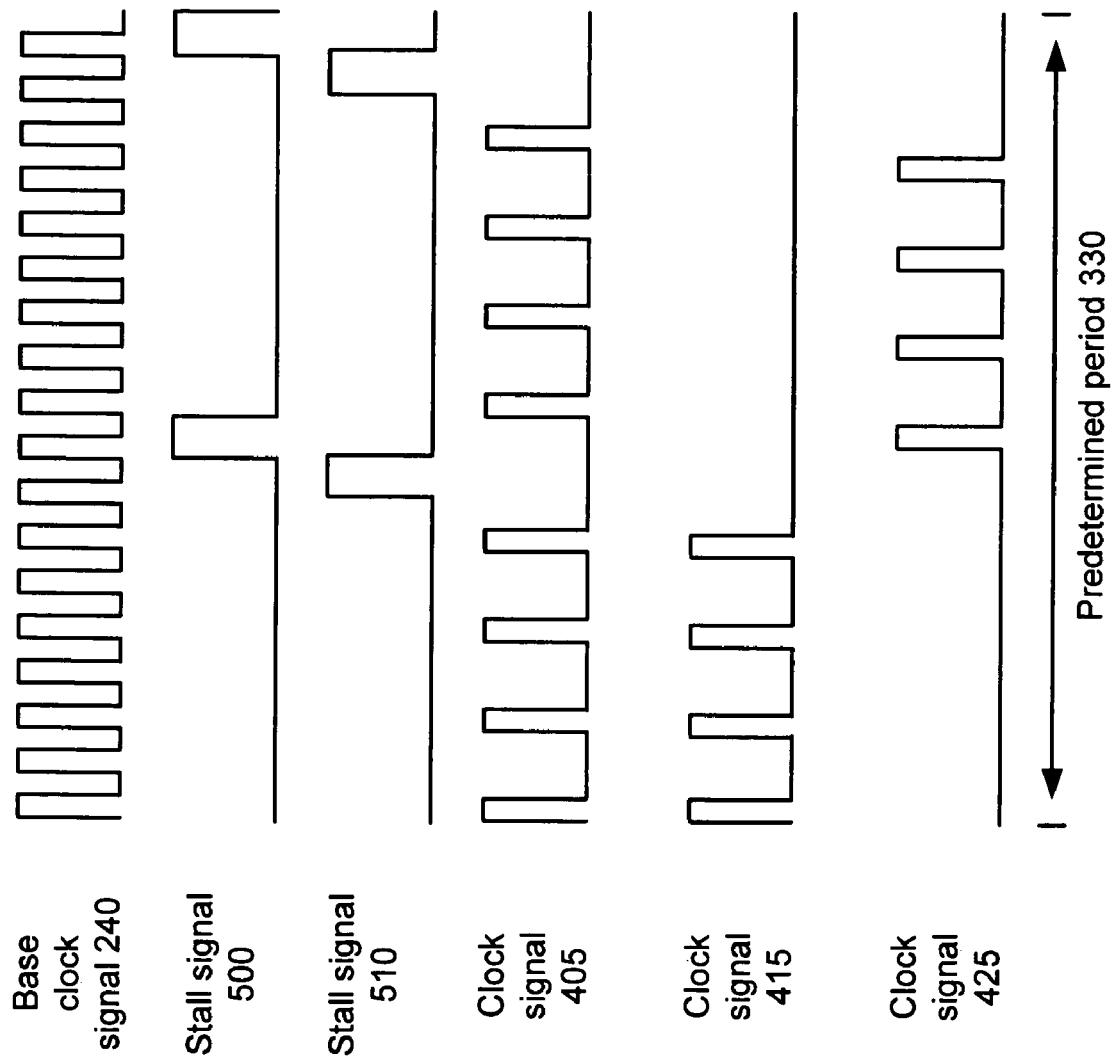
FIG. 16 presents a timing diagram in accordance with an embodiment of the present invention.

FIG. 16 presents a timing diagram in accordance with an embodiment of the present invention. In particular, a predetermined period 330 is shown that corresponds to eighteen cycles of base clock signal 240 and stall signals 500 and 510 are generated as presented in conjunction with FIG. 12. Stall signal 500 operates to insert two stall cycles in clock signal 404 (that is now generated at a higher frequency due to the frequency increase in base clock signal 240) to form clock signal 405. Stall signal 510 operates to insert two stall cycles in clock signals 414 and 424 to form clock signals 415 and 425. In this fashion, digital clock generator 238 operates to control the clock signals 4105, 415 and 425 to first, second and third digital modules to maintain eight clock cycles during predetermined period 330.

While FIGS. 12, 14 and 16 present embodiments of the present invention whereby the stall cycles are distributed substantially uniformly over the predetermined period 330, this is not always possible depending on the number of stall cycles to be inserted in the predetermined period 330. In an embodiment of the present invention, the clock cycles and stall cycles of the digital clock signals 248 are spread substantially evenly over predetermined period 330, however, more complex distribution schemes, such as other periodic distribution, random or pseudorandom distribution are likewise possible within the broad scope of the present invention. While FIGS. 12, 14 and 16 present embodiments each with two inserted stall cycles, other numbers of stall cycles may likewise be inserted at other values of the control signal 251. Also, note that in practice there may be occasional pulses that synchronous between clock signals such as 405 and 415 due practical constraints such that include latching data between different submodules. These occasional coincident clock pulses are acceptable within the scope of the invention, and don't affect the characterization of digital clocks signals such as 405 and 415 as substantially interleaved or time shifted relative to each other.

While the interleaving of clock cycles from two modules have been shown as alternating between single clock cycles of each module in an ABABAB . . . pattern, other more complex interleaving patterns can likewise be implemented including AABBAABB . . . , ABBAABBA . . . , AAABAAABAAAB . . . AABAAABAABAAAB . . . and other patterns that intersperse an equal or unequal number of the clock cycles from two modules over a predetermined period. In addition, clock cycles from three or more modules can be interleaved in a variety of patterns such as ABCABCABC . . . , AABC-CDAABCCD . . . , AAABCAAABC . . . , ABCABABC . . . and in other patterns that intersperse an equal or unequal number of the clock cycles from three or more modules over a predetermined period. In embodiments of the present invention, the clock signals A, B, C, D, . . . may be overlapping or non-overlapping, simultaneous, substantially simultaneous or alternating.

Figure 17:
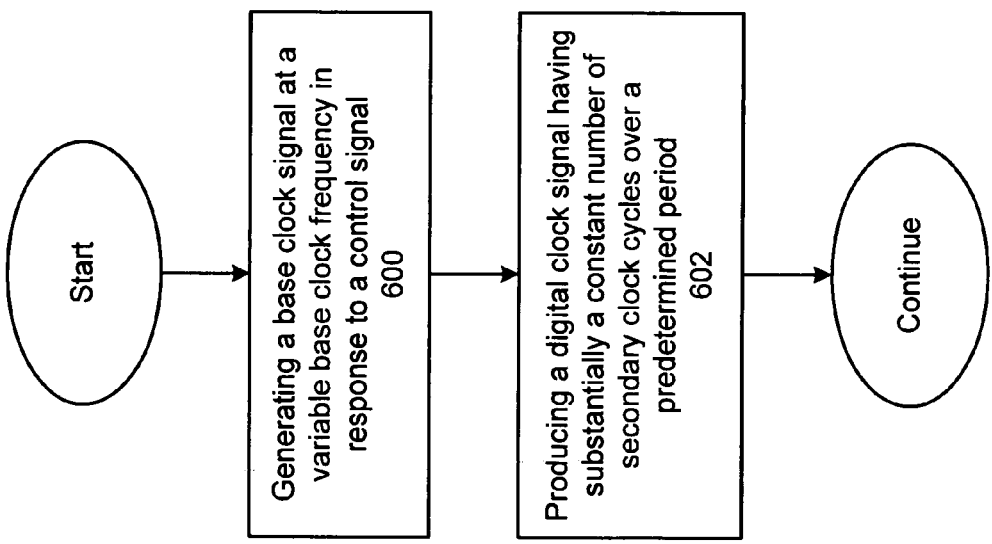
FIG. 17 presents a flowchart representation of a method in accordance with an embodiment of the present invention.

FIG. 17 presents a flowchart representation of a method in accordance with an embodiment of the present invention. In particular, a method is presented for use in conjunction with embodiments presented in FIGS. 1-16. The method begins in step 600 by generating a base clock signal at a variable base clock frequency in response to a control signal. In step 602 a digital clock signal is generated having a substantially constant number of digital clock cycles over a predetermined period.

Figure 18:
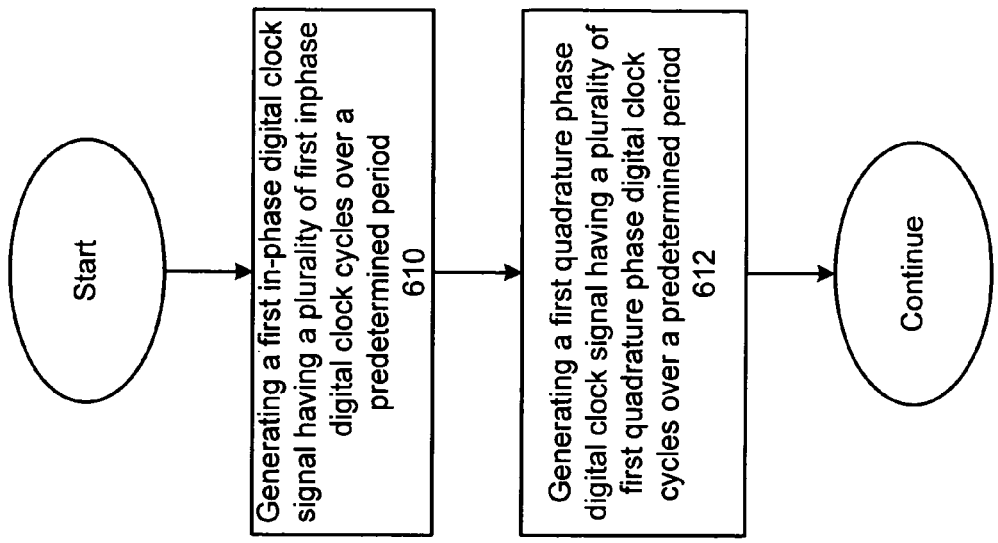
FIG. 18 presents a flowchart representation of a method in accordance with an embodiment of the present invention.

FIG. 18 presents a flowchart representation of a method in accordance with an embodiment of the present invention. In particular, a method is presented for use in conjunction with embodiments presented in FIGS. 1-17. In step 610 a first in-phase digital clock signal is generated having a plurality of first in-phase digital clock cycles over a predetermined period. In step 612, a first quadrature phase digital clock signal is generated having a plurality of first quadrature phase digital clock cycles over the predetermined period, wherein the plurality of first in-phase digital clock cycles are substantially interleaved with or time shifted with respect to the plurality of first quadrature phase digital clock cycles over the predetermined period.

In an embodiment of the present invention, the plurality of first in-phase digital clock cycles are equal to the plurality of first quadrature phase digital clock cycles over the predetermined period. In an embodiment, the plurality of first in-phase digital clock cycles substantially alternate with one or more of the plurality of first quadrature phase digital clock cycles over the predetermined period. Further, at least one of the plurality of first in-phase digital clock cycles is generated in synchronism with at least one of the plurality of first quadrature phase digital clock cycles over the predetermined period.

Figure 19:
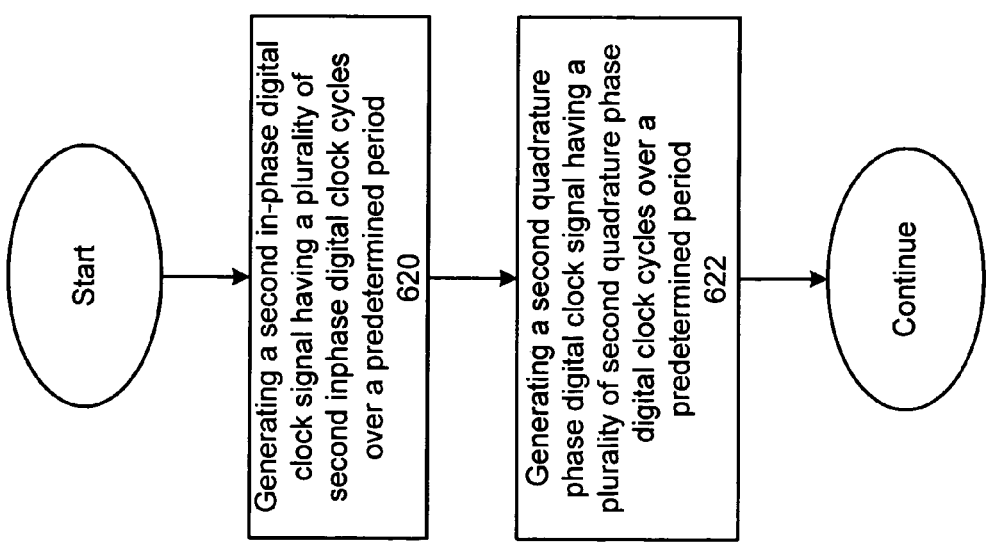
FIG. 19 presents a flowchart representation of a method in accordance with an embodiment of the present invention.

FIG. 19 presents a flowchart representation of a method in accordance with an embodiment of the present invention. In particular, a method is presented for use in conjunction with embodiments presented in FIGS. 1-18. In particular, steps 620 is presented for generating a second in-phase digital clock signal having a plurality of second in-phase digital clock cycles over a predetermined period. In step 622, a second quadrature phase digital clock signal is generated having a plurality of second quadrature phase digital clock cycles over the predetermined period, wherein the plurality of second in-phase digital clock cycles are substantially interleaved with or time shifted with respect to the plurality of second quadrature phase digital clock cycles over the predetermined period.

Figure 20:
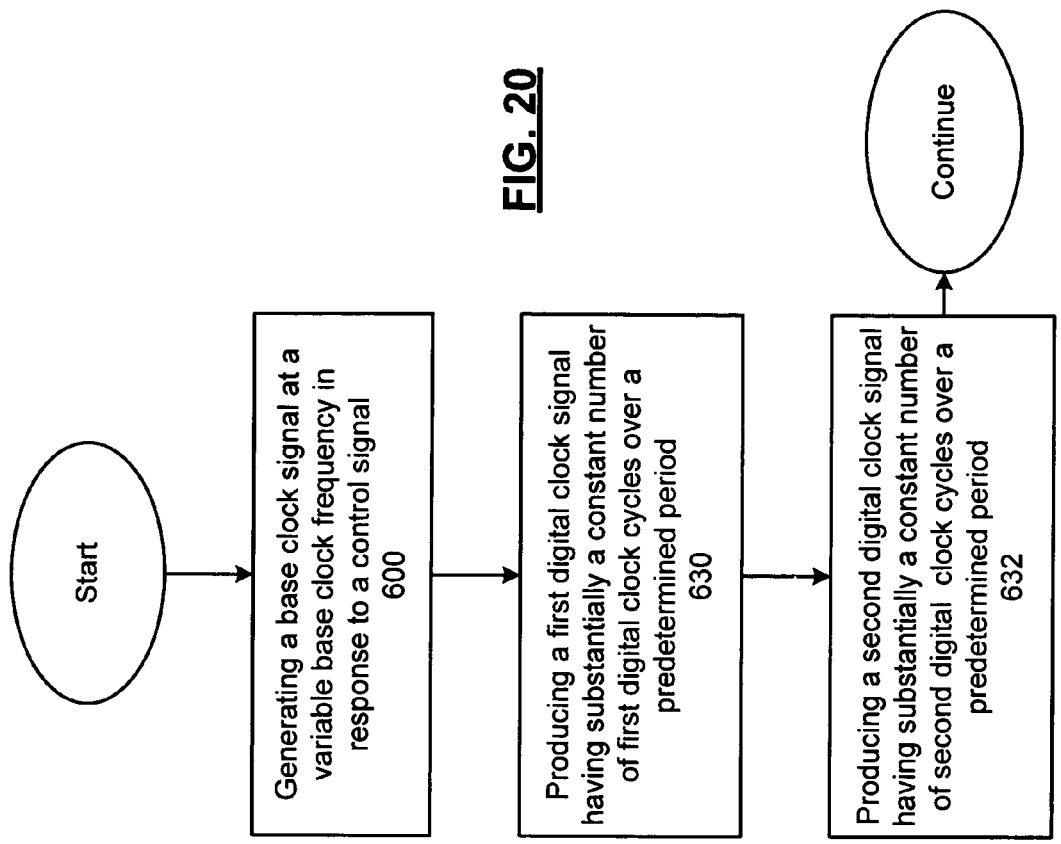
FIG. 20 presents a flowchart representation of a method in accordance with an embodiment of the present invention.

FIG. 20 presents a flowchart representation of a method in accordance with an embodiment of the present invention. In particular, a method is presented for use in conjunction with embodiments presented in FIGS. 1-19. Step 600 is as described in conjunction with FIG. 17. In step 630, a first digital clock signal is generated having a substantially constant number of first digital clock cycles over a predetermined period. In step 632 a second digital clock signal is generated having a substantially constant number of second digital clock cycles over the predetermined period.

In an embodiment of the present invention, the plurality of first digital clock cycles are not equal to the plurality of second digital clock cycles over the predetermined period. Further, the predetermined period is one of: a sample period, a decimation period, and a computational period of an integrated circuit. In addition, at least one of the plurality of first digital clock cycles is in synchronism with at least one of the plurality of second digital clock cycles over the predetermined period.

Figure 21:
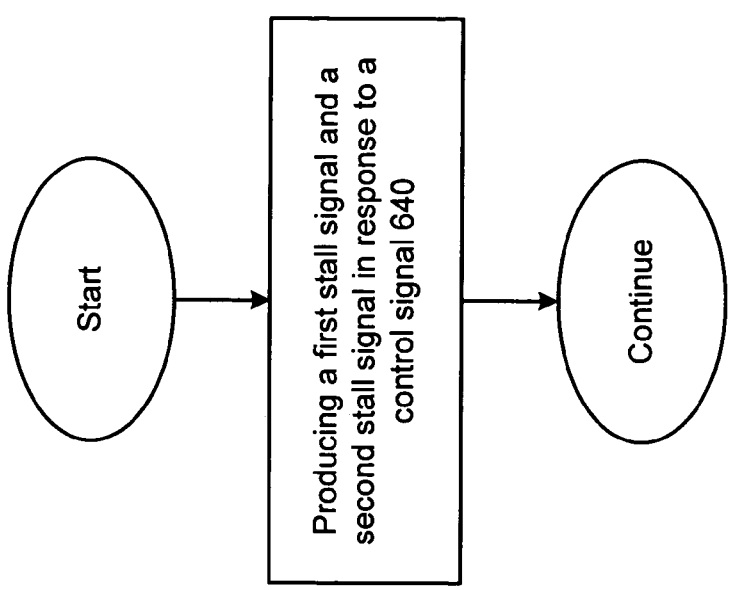
FIG. 21 presents a flowchart representation of a method in accordance with an embodiment of the present invention.

FIG. 21 presents a flowchart representation of a method in accordance with an embodiment of the present invention. In particular, a method is presented for use in conjunction with embodiments presented in FIGS. 1-20. In step 640, a first stall signal and a second stall signal are produced in response to a first value of the control signal, wherein a step of generating a first digital clock signal (such as in steps 602, 610, 620 or 630) includes selectively inserting at least one stall cycle in response to the first stall signal and wherein a step of generating a second digital clock signal (such as steps 612, 622 or 632) includes selectively inserting at least one stall cycle in response to the second stall signal. In an embodiment of the present invention, the first stall signal is asserted at least one time when the second stall signal is deasserted and wherein the second stall signal is asserted at least one time when the first stall signal is deasserted.

Figure 22:
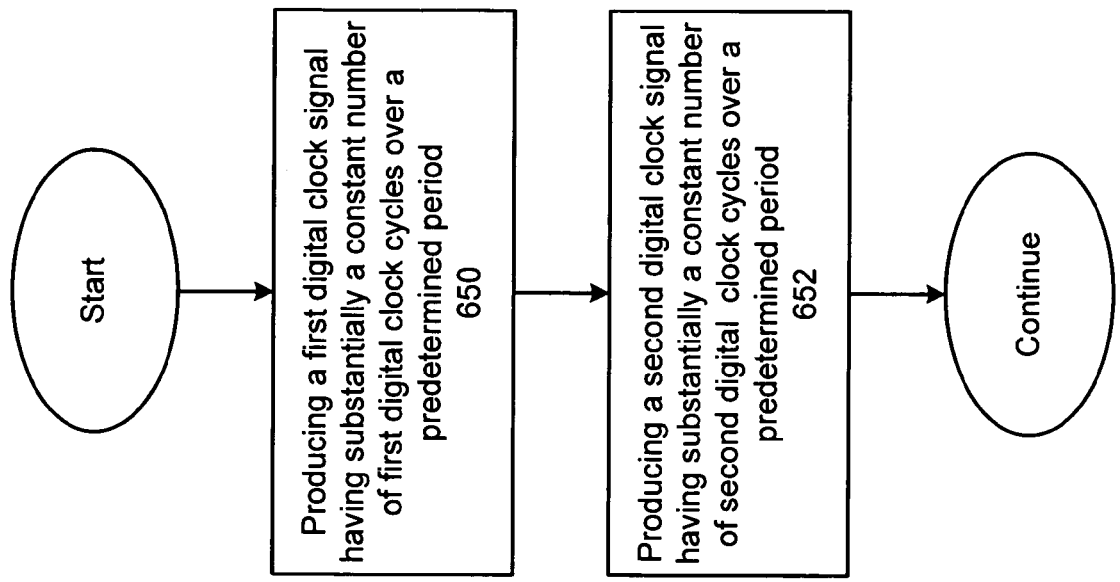
FIG. 22 presents a flowchart representation of a method in accordance with an embodiment of the present invention.

FIG. 22 presents a flowchart representation of a method in accordance with an embodiment of the present invention. In particular, a method is presented for use in conjunction with embodiments presented in FIGS. 1-21. In step 650, a base clock signal is generated having a plurality of first digital clock cycles over a predetermined period to clock a first digital module. In step 652, a second digital clock signal is generated having a plurality of second digital clock cycles over the predetermined period to clock a second digital module, wherein the plurality of first digital clock cycles are substantially interleaved with the plurality of second digital clock cycles over the predetermined period, and wherein the second digital module generates an output during the predetermined period that is based on an output of the first digital module generated during a prior predetermined period.

In an embodiment of the present invention, the plurality of first digital clock cycles are not equal to the plurality of second digital clock cycles over the predetermined period. In alternative embodiment, the plurality of first digital clock cycles are equal to the plurality of second digital clock cycles over the predetermined period. Further, the plurality of first digital clock cycles can alternate with one or more of the plurality of second digital clock cycles over the predetermined period. In an embodiment, at least one of the plurality of first digital clock cycles is generated in synchronism with at least one of the plurality of second digital clock cycles over the predetermined period. Also, the predetermined period is one of: a sample period, a decimation period, and a computational period.

Figure 23:
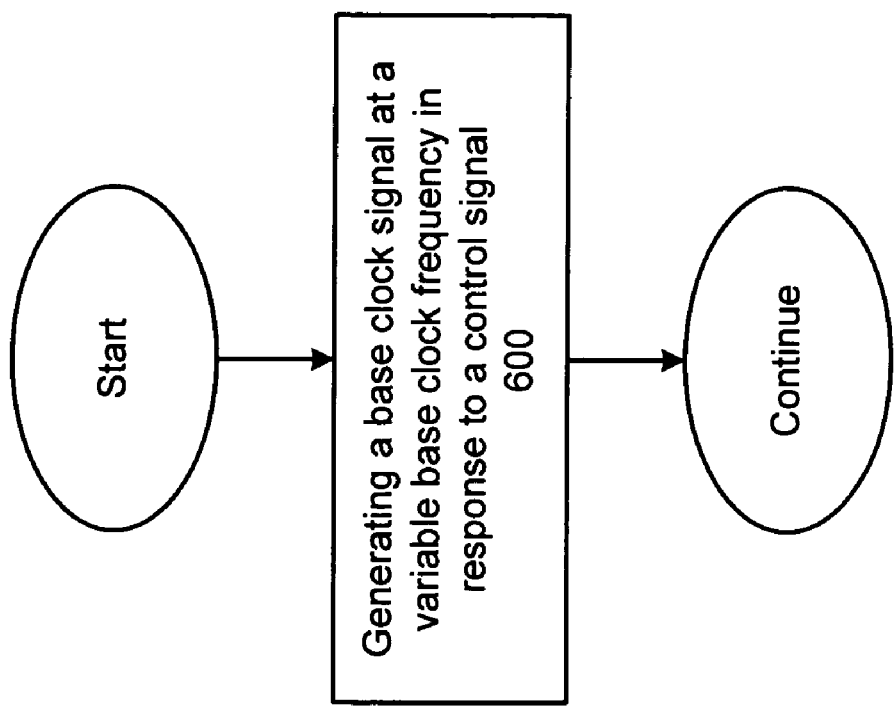
FIG. 23 presents a flowchart representation of a method in accordance with an embodiment of the present invention.

FIG. 23 presents a flowchart representation of a method in accordance with an embodiment of the present invention. In particular, a method is presented for use in conjunction with embodiments presented in FIGS. 1-22. In particular, step 600 as previously discussed, includes generating a base clock signal at a base clock frequency that varies based on a control signal and may be used in conjunction with the methods of FIGS. 18, 19, 21 and 22.

In an embodiment of the present invention, step 602 includes producing a stall signal in response to a first value of the control signal, and selectively inserting at least one stall cycle in a preliminary clock signal over the predetermined period in response to the stall signal. Step 602 can also include producing the digital clock signal by inserting a plurality of stall cycles in a preliminary clock signal over the predetermined period at a second value of the control signal and producing the digital clock signal by inserting no stall cycles in the preliminary clock signal over the predetermined period at a third value of the control signal. In an embodiment, step 602 includes inserting a delay in the preliminary clock signal having a duration of one stall cycle when the stall signal is asserted.

In preferred embodiments, the various circuit components are implemented using 0.35 micron or smaller CMOS technology. Provided however that other circuit technologies, both integrated or non-integrated, may be used within the broad scope of the present invention. Likewise, various embodiments described herein can also be implemented as software programs running on a computer processor. It should also be noted that the software implementations of the present invention can be stored on a tangible storage medium such as a magnetic or optical disk, read-only memory or random access memory and also be produced as an article of manufacture.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled". As one of ordinary skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As the term circuit module is used in the description of the various embodiments of the present invention, a circuit module includes a functional block that is implemented in hardware, software, and/or firmware that performs one or module functions including the processing of an input signal to produce an output signal. As used herein, a circuit module may contain submodules that themselves are circuit modules.

Thus, there has been described herein an apparatus and method, as well as several embodiments including a preferred embodiment, for implementing a digital clock controller, radio receiver and system on a chip integrated circuit. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. A radio receiver comprising:
    an analog front end for receiving a received radio signal containing a selected one of a plurality of channel signals, and for converting the selected one of the plurality of channel signals into a digital signal that includes an in-phase signal and a quadrature phase signal;
    a digital section, operably coupled to the analog front end, for converting the digital signal into at least one audio signal that corresponds to the selected one of the plurality of channel signals, the digital section having a first in-phase digital submodule and a first quadrature phase digital submodule; and
    a digital clock generator, operably coupled to the first in-phase digital submodule and the first quadrature phase digital submodule, for generating a first in-phase digital clock signal having a plurality of first in-phase digital clock cycles over a predetermined period and a first quadrature phase digital clock signal having a plurality of first quadrature phase digital clock cycles over the predetermined period, wherein the plurality of first in-phase digital clock cycles are substantially interleaved with the plurality of first quadrature phase digital clock cycles over the predetermined period, wherein the digital clock generator generates a base clock signal at a base clock frequency that varies based on the selected one of the plurality of channel signals, wherein the plurality of first in-phase digital clock cycles and the plurality of first quadrature phase digital clock cycles are substantially constant over the predetermined period, wherein the base clock frequency is less than a carrier frequency of the selected one of the plurality of channel signals, and wherein the base clock frequency and integer multiples of the base clock frequency are not equal to the carrier frequency of the selected one of the plurality of channel signals.

2. The radio receiver of claim 1 wherein the plurality of first in-phase digital clock cycles are equal to the plurality of first quadrature phase digital clock cycles over the predetermined period.

3. The radio receiver of claim 1 wherein the digital clock generator substantially alternates between generating one or more of the plurality of first in-phase digital clock cycles with one or more of the plurality of first quadrature phase digital clock cycles over the predetermined period.

4. The radio receiver of claim 1 wherein the digital clock generator generates at least one of the plurality of first in-phase digital clock cycles in synchronism with at least one of the plurality of first quadrature phase digital clock cycles over the predetermined period.

5. The radio receiver of claim 1 wherein the received radio signal is one of: a broadcast frequency modulated radio signal, a broadcast amplitude modulated radio signal, a broadcast satellite radio signal, IBOC digital radio signal, Bluetooth radio signal and a broadcast cable signal.

6. The radio receiver of claim 1 wherein at least one of: the analog front end, the digital clock generator, and the digital section, are implemented as part of a system on a chip integrated circuit.

7. A system on a chip integrated circuit (IC) comprising:
    a first in-phase digital submodule;
    a first quadrature phase digital submodule;
    a second in-phase digital submodule;
    a second quadrature phase digital submodule; and
    a digital clock generator, operably coupled to the first in-phase digital submodule, the first quadrature phase digital submodule, the second in-phase digital submodule, and the second quadrature phase digital submodule, for generating a first in-phase digital clock signal having a plurality of first in-phase digital clock cycles over a predetermined period and a first quadrature phase digital clock signal having a plurality of first quadrature phase digital clock cycles over the predetermined period, wherein the plurality of first in-phase digital clock cycles are substantially interleaved with the plurality of first quadrature phase digital clock cycles over the predetermined period, wherein the digital clock generator generates a second in-phase digital clock signal having a plurality of second in-phase digital clock cycles over the predetermined period and a second quadrature phase digital clock signal having a plurality of second quadrature phase digital clock cycles over the predetermined period, and wherein the plurality of second in-phase digital clock cycles are substantially interleaved with the plurality of second quadrature phase digital clock cycles over the predetermined period;
    wherein the first in-phase digital submodule and the first quadrature phase digital submodule are operable to produce at least one output signal based on at least one input signal.

8. The system on a chip integrated circuit (IC) of claim 7 wherein the plurality of first in-phase digital clock cycles are equal to the plurality of first quadrature phase digital clock cycles over the predetermined period.

9. The system on a chip integrated circuit (IC) of claim 7 wherein the digital. clock generator generates a base clock signal at a base clock frequency that varies based on a control signal and wherein the plurality of first in-phase digital clock cycles and the plurality of first quadrature phase digital clock cycles are substantially constant over the predetermined period.

10. The system on a chip integrated circuit (IC) of claim 7 wherein the digital clock generator substantially alternates between generating one or more of the plurality of first in-phase digital clock cycles with one or more of the plurality of first quadrature phase digital clock cycles over the predetermined period.

11. The system on a chip integrated circuit (IC) of claim 7 wherein the digital clock generator generates at least one of the plurality of first in-phase digital clock cycles in synchronism with at least one of the plurality of first quadrature phase digital clock cycles over the predetermined period.

12. A radio receiver comprising:
    an analog front end for receiving a radio signal containing a selected one of a plurality of channel signals, and for converting the selected one of the plurality of channel signals into a digital signal that includes an in-phase signal and a quadrature phase signal;
    a digital section, operably coupled to the analog front end, for converting the digital signal into at least one audio signal that corresponds to the selected one of the plurality of channel signals, the digital section having a first in-phase digital submodule, a first quadrature phase digital submodule, a second in-phase digital submodule, and a second quadrature phase digital submodule; and a digital clock generator, operably coupled to the first in-phase digital submodule and the first quadrature phase digital submodule, for generating a first in-phase digital clock signal having a plurality of first in-phase digital clock cycles over a predetermined period and a first quadrature phase digital clock signal having a plurality of first quadrature phase digital clock cycles over the predetermined period, wherein the plurality of first in-phase digital clock cycles are substantially interleaved with the plurality of first quadrature phase digital clock cycles over the predetermined period, wherein the digital clock generator generates a second in-phase digital clock signal having a plurality of second in-phase digital clock cycles over the predetermined period and a second quadrature phase digital clock signal having a plurality of second quadrature phase digital clock cycles over the predetermined period, and wherein the plurality of second in-phase digital clock cycles are substantially interleaved with the plurality of second quadrature phase digital clock cycles over the predetermined period.

* * * * *